(12) United States Patent
Fortier

(10) Patent No.: US 8,560,552 B2
(45) Date of Patent: Oct. 15, 2013

(54) METHOD FOR LOSSLESS DATA REDUCTION OF REDUNDANT PATTERNS

(75) Inventor: Mario Fortier, Chelmsford, MA (US)

(73) Assignee: Sycamore Networks, Inc., Chelmsford, MA (US)

(*) Notice: Subject to any disclaimer, the term of this patent is extended or adjusted under 35 U.S.C. 154(b) by 206 days.

(21) Appl. No.: 12/704,056

(22) Filed: Feb. 11, 2010

(65) Prior Publication Data

US 2011/0173209 A1 Jul. 14, 2011

Related U.S. Application Data

(63) Continuation-in-part of application No. 12/684,427, filed on Jan. 8, 2010.

(51) Int. Cl.
*G06F 17/30* (2006.01)

(52) U.S. Cl.
USPC .......................................... 707/747; 709/247

(58) Field of Classification Search
USPC ............. 341/50; 711/220; 707/609, 812, 803, 707/104, 706
See application file for complete search history.

(56) References Cited

U.S. PATENT DOCUMENTS

| | | | | |
|---|---|---|---|---|
| 4,730,348 A | * | 3/1988 | MacCrisken | 375/240 |
| 5,049,881 A | * | 9/1991 | Gibson et al. | 341/95 |
| 5,721,830 A | * | 2/1998 | Yeh et al. | 709/237 |
| 5,924,114 A | * | 7/1999 | Maruyama et al. | 711/110 |
| 6,021,408 A | * | 2/2000 | Ledain et al. | 707/823 |
| 6,108,666 A | * | 8/2000 | Floratos et al. | 1/1 |
| 6,363,470 B1 | * | 3/2002 | Laurenti et al. | 711/220 |
| 6,490,252 B1 | | 12/2002 | Riggan et al. | |
| 6,757,291 B1 | | 6/2004 | Hu | |

(Continued)

FOREIGN PATENT DOCUMENTS

| WO | 95/19662 A1 | 7/1995 |
|---|---|---|
| WO | 01/86988 A1 | 11/2001 |
| WO | 2007/123760 A2 | 11/2007 |
| WO | 2011/085312 A1 | 7/2011 |

OTHER PUBLICATIONS

Lte, "3rd Generation Partnership Project; Technical Specification Group Services and System Aspects; Local IP Access and Selected IP Traffic Offload; (Release 10)," 3GPP TR 23.829 V0.3.1 (Nov. 2009) Technical Report (2009).

(Continued)

*Primary Examiner* — James Trujillo
*Assistant Examiner* — Thong Vu
(74) *Attorney, Agent, or Firm* — Nelson Mullins Riley & Scarborough LLP

(57) ABSTRACT

The present application describes methods and systems for compressing and/or decompressing data. As blocks of data are processed, the processed blocks are placed into a circular buffer at a compressor and indexed based on patterns of data present in the processed blocks. A circular buffer is maintained at the decompressor so that the decompressor circular buffer is consistent with the compressor circular buffer. When a new block of data is processed, the compressor checks the index to the circular buffer to determine whether the new block of data contains a pattern that is redundant with a pattern in one or more blocks of data that have already been processed. If a redundancy is detected, the compressor informs the decompressor of the redundancy and provides information allowing the decompressor to reconstruct the redundant pattern from the decompressor's circular buffer. In this way, redundant data need not be retransmitted or stored.

21 Claims, 14 Drawing Sheets

(56) References Cited

U.S. PATENT DOCUMENTS

| | | | |
|---|---|---|---|
| 7,003,533 B2* | 2/2006 | Noguchi et al. | 1/1 |
| 7,657,938 B2 | 2/2010 | Palmer, Jr. et al. | |
| 7,689,633 B1* | 3/2010 | Li et al. | 707/821 |
| 7,733,247 B1* | 6/2010 | He et al. | 341/50 |
| 7,742,406 B1 | 6/2010 | Muppala | |
| 7,773,507 B1 | 8/2010 | Kasralikar et al. | |
| 7,774,304 B2* | 8/2010 | Banzon et al. | 707/609 |
| 7,885,988 B2* | 2/2011 | Bashyam et al. | 707/812 |
| 7,926,108 B2 | 4/2011 | Rand et al. | |
| 8,024,313 B2* | 9/2011 | Mousavi et al. | 707/706 |
| 8,037,105 B2* | 10/2011 | Kegel et al. | 707/803 |
| 8,219,508 B2* | 7/2012 | McMillen et al. | 706/12 |
| 2003/0217166 A1* | 11/2003 | Dal Canto et al. | 709/229 |
| 2005/0044422 A1 | 2/2005 | Cantrell et al. | |
| 2007/0124788 A1* | 5/2007 | Wittkoter | 725/112 |
| 2008/0095175 A1 | 4/2008 | Grandhi et al. | |
| 2008/0162574 A1* | 7/2008 | Gilbert | 707/104.1 |
| 2008/0242224 A1 | 10/2008 | Fratti et al. | |
| 2009/0187673 A1* | 7/2009 | Ramjee et al. | 709/247 |
| 2009/0217322 A1* | 8/2009 | Hindle | 725/39 |
| 2009/0265777 A1 | 10/2009 | Scott | |
| 2010/0027533 A1 | 2/2010 | Kant et al. | |
| 2010/0034089 A1 | 2/2010 | Kovvali et al. | |
| 2010/0318505 A1* | 12/2010 | Fisher et al. | 707/706 |
| 2011/0134830 A1 | 6/2011 | Lin | |
| 2011/0170429 A1 | 7/2011 | Cao et al. | |

OTHER PUBLICATIONS

Stoke Inc., "Stoke Mobile Data Offload Solution Brief," retrieved online at: http://www.stoke.com/Solutions/smdo.asp (2009).

International Search Report for Application No. PCT/US2011/020683, dated Mar. 21, 2011.

Bentley, Jon et al., "Data Compression Using Long Common Strings," Proceedings of the Data Compression Conference DCC '99, pp. 287-295 (1999).

International Search Report and Written Opinion for Application No. PCT/US2011/024198, dated May 17, 2011.

International Search Report and Written Opinion for Application No. PCT/US2011/024206, dated May 13, 2011.

International Preliminary Report on Patentability for Application No. PCT/US2011/020683, 11 pages, dated Apr. 3, 2012.

Written Opinion for Application No. PCT/US2011/024198, 7 pages, dated Apr. 10, 2012.

International Preliminary Report on Patentability for Application No. PCT/US2011/024206, 10 pages, dated May 2, 2012.

International Preliminary Report on Patentability for Application No. PCT/US2011/024198, 11 pages, dated Jun. 21, 2012.

Written Opinion for Application No. PCT/US2011/024206, pp. 1-9, dated Mar. 6, 2012.

* cited by examiner

*Data Structure Update*

| 400 NRD-CMD Non-Redundant Data Command | 402 Non-Redundant Data | 404 PF-CMD Pattern Found Command | 406 PF-CMD Pattern Found Command | 408 NRDTE-CMD Non-Redundant Data to End Command | 410 Non-Redundant Data |

Fig. 4A

| 450 NRD-CMD Non-Redundant Data Command | 452 PF-CMD Pattern Found Command | 454 PF-CMD Pattern Found Command | 456 NRDTE-CMD Non-Redundant Data to End Command | 458 Non-Redundant Data | 460 Non-Redundant Data |

Fig. 4B

Compressor

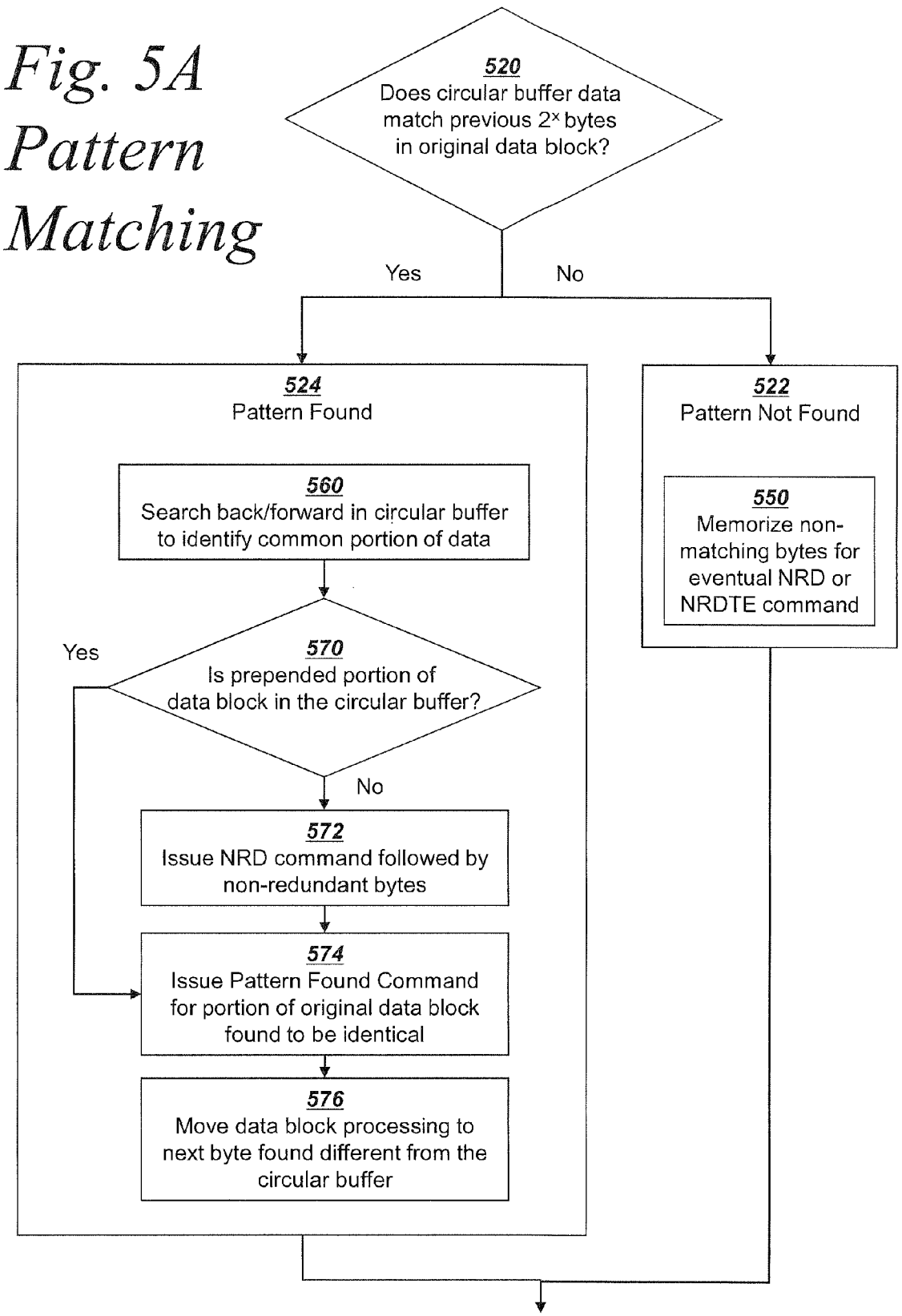

*Remaining Bytes*

Decompressor

Alternate
Transformation
(Decompressor)

Alternate
Transformation
(Compressor)

METHOD FOR LOSSLESS DATA REDUCTION OF REDUNDANT PATTERNS

RELATED APPLICATION DATA

This application is a Continuation in Part of, and claims priority to, U.S. patent application Ser. No. 12/684,427, entitled "Mobile Broadband Packet Switched Traffic Optimization," filed on Jan. 8, 2010. The contents of the aforementioned Application are hereby incorporated by reference.

BACKGROUND

When data is transmitted in a network, the amount of data transmitted can have an effect on the efficiency of the network which may in turn affect user experience. For example, if a large amount of data is transmitted through the network at a particular time, the network devices that route the data may be inundated, causing incoming data to be queued or buffered. As a result, it takes longer for users in the network to receive the data.

One conventional solution to this problem is to add more network devices to process the data. However, this solution can be expensive and cumbersome, requiring an investment in additional network devices and further requiring existing network devices to be reconfigured. Adding additional network devices may also be wasteful, because the problem of device inundation is most apparent during periods of high network utilization. During these periods, network usage can increase greatly over a short period of time, causing usage spikes. Additional network devices are helpful during the usage spikes, but during periods of normal network utilization the additional devices are unnecessary and may complicate the network architecture.

Another solution is to employ compression on the data transiting the network. Compression is a procedure that takes original data and encodes the data using fewer information units (for example, bits) than the original data. Compression is a form of network optimization. The term "optimization" typically includes elements and operations that improve the speed or efficiency of data transmission in the network, or allow data transmission to be accomplished with fewer resources. However, an "optimization" need not enable optimal or maximal data transmission. Compressing the data in the network reduces the amount of information transiting the network, and therefore reduces the number of devices needed to handle network traffic. The selection of an appropriate compression algorithm is key to network efficiency. For example, although the goal of compression is to reduce the number of information units used to encode data, in some circumstances a compression algorithm can actually increase the number of information units used to encode the data due to additional information stored along with the compressed data. Selecting the wrong compression algorithm therefore can undesirably generate more traffic.

Further, compressed data needs to be decompressed in order to be transformed back into its original format. This may necessitate the transmission of additional control messages through the network. Compressing data and decompressing data require processing resources. Thus, network devices must be capable of handling the processing of compression and decompression and the processing required to route messages.

Still further, compression algorithms consume other resources in network devices in addition to processing resources. Compression typically requires memory resources for storing information related to the compression algorithm and the data being compressed. If an inappropriate compression algorithm is selected, the memory footprint associated with the compression algorithm becomes quite large and consumes a great deal of the memory resources, or consumes expensive external disk or solid state storage.

Moreover, compression algorithms may not solve the problem of usage spikes. While compressing information may reduce the amount of network traffic, compression typically applies to all messages transiting the network. Therefore, compression may reduce the size of a usage spike versus non-compressed network traffic (in addition to reducing the amount of traffic outside of a spike), but conventional compression schemes are typically not good candidates for smoothing usage spikes. Because usage spikes still occur, additional devices may still be needed, even in a network employing compression.

SUMMARY

A system and method provide faster, more efficient compression. The system and method require fewer processing resources and a smaller memory footprint than traditional compression techniques, and are capable of smoothing usage spikes in network environments so that network utilization becomes more consistent.

Although exemplary embodiments will be described in the context of compression and decompression in a network, one of ordinary skill in the art will understand that the present invention is not so limited. For example, the compression and decompression methods described herein may be used in an electronic device to compress or decompress a locally-stored file, a set of files, a backup, operating system filesystems, or other representations of data.

The present application describes methods and devices for compressing and/or decompressing data. As blocks of data are processed, the processed blocks are placed into a circular buffer at a compressor and indexed based on patterns of data present in the processed blocks. Using the index, the patterns in the data can be retrieved quickly. A circular buffer is maintained at the decompressor so that the decompressor circular buffer is consistent with the compressor circular buffer. When a new block of data is processed, the compressor checks the index to the circular buffer to determine whether the new block of data contains a pattern that is redundant with a pattern in one or more blocks of data that have already been processed. If a redundancy is detected, the compressor informs the decompressor of the redundancy and provides information allowing the decompressor to reconstruct the redundant pattern from the decompressor's circular buffer. In this way, redundant data need not be retransmitted, resulting in smaller transmissions. When employed in a network, the result of the compression methods and devices described above is less network traffic, particularly during periods of peak usages when redundant message data is most prevalent. Additionally, when the present compression methods are employed on a set of files or other (potentially non-networked) data representation, the compressed representation of the data is smaller, which saves memory space.

The methods described herein utilize a circular buffer to store recent original data being processed. The circular buffer allows for faster processing and a smaller memory footprint than traditional compression algorithms, which typically utilize a first-in, first-out (FIFO) queue of data blocks. Moreover, the present application performs pattern matching on a set of data using a hashing value calculated at regular, fixed boundaries in the circular buffer. Using fixed boundaries further reduces the memory footprint associated with the compression and decompression methods.

The methods of the present application allow for the detection of redundancy or patterns in data. In contrast to conventional compression techniques, this redundancy may overlap multiple units of data in the original set of data, providing a greater compression ratio. Further, the methods described provide for a low-complexity decompressor because the methods refer to past patterns only by an offset and a length in a synchronized circular buffer.

The methods described herein also support relatively small hashing values, which reduces memory footprint and increases efficiency. The present application also supports co-existence with other packet transformations, as described in more detail below.

In sum, the described methods provide fast redundant pattern detection with a small memory footprint.

The compression methods described herein may optionally be deployed on a bypass device located in the network. The bypass device may receive and transmit data in order to bypass one or more devices in the network. The bypass device may compress data and forward the compressed data to a device downstream of the bypassed network devices. A remote node may be provided downstream of the bypassed devices to decompress the data and forward the decompressed data towards its final destination. Using the bypass device and the remote node may allow the compression methods described herein to be used in a network without requiring that existing network devices be replaced or reprogrammed.

According to one embodiment, a method is performed in an electronic device. The method compresses and/or decompresses data in a network. According to other embodiments, an electronic device readable storage medium storing executable instructions for compressing and/or decompressing data in a network is also provided.

BRIEF DESCRIPTION OF THE DRAWINGS

FIG. 4A graphically depicts a compressed data block according to a first embodiment.

FIG. 4B graphically depicts a compressed data block according to a second embodiment

FIG. 5A is a flow chart depicting the Pattern Not Found block 522 and the Pattern Found block 524 of FIG. 5 in more detail.

DETAILED DESCRIPTION

Figure 1:
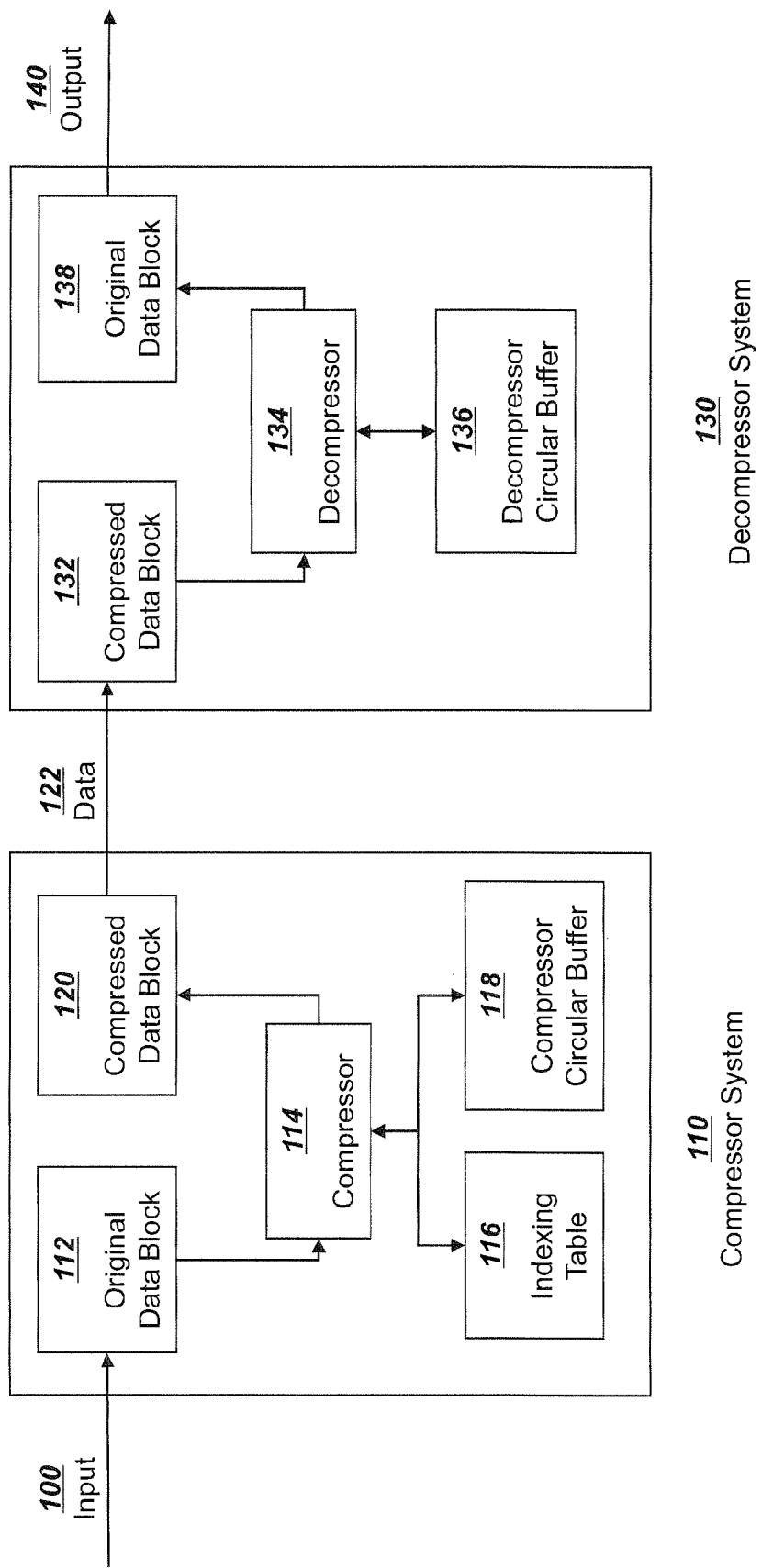
FIG. 1 depicts a data flow between a compressor system and decompressor system according to exemplary embodiments.
Figure 2:
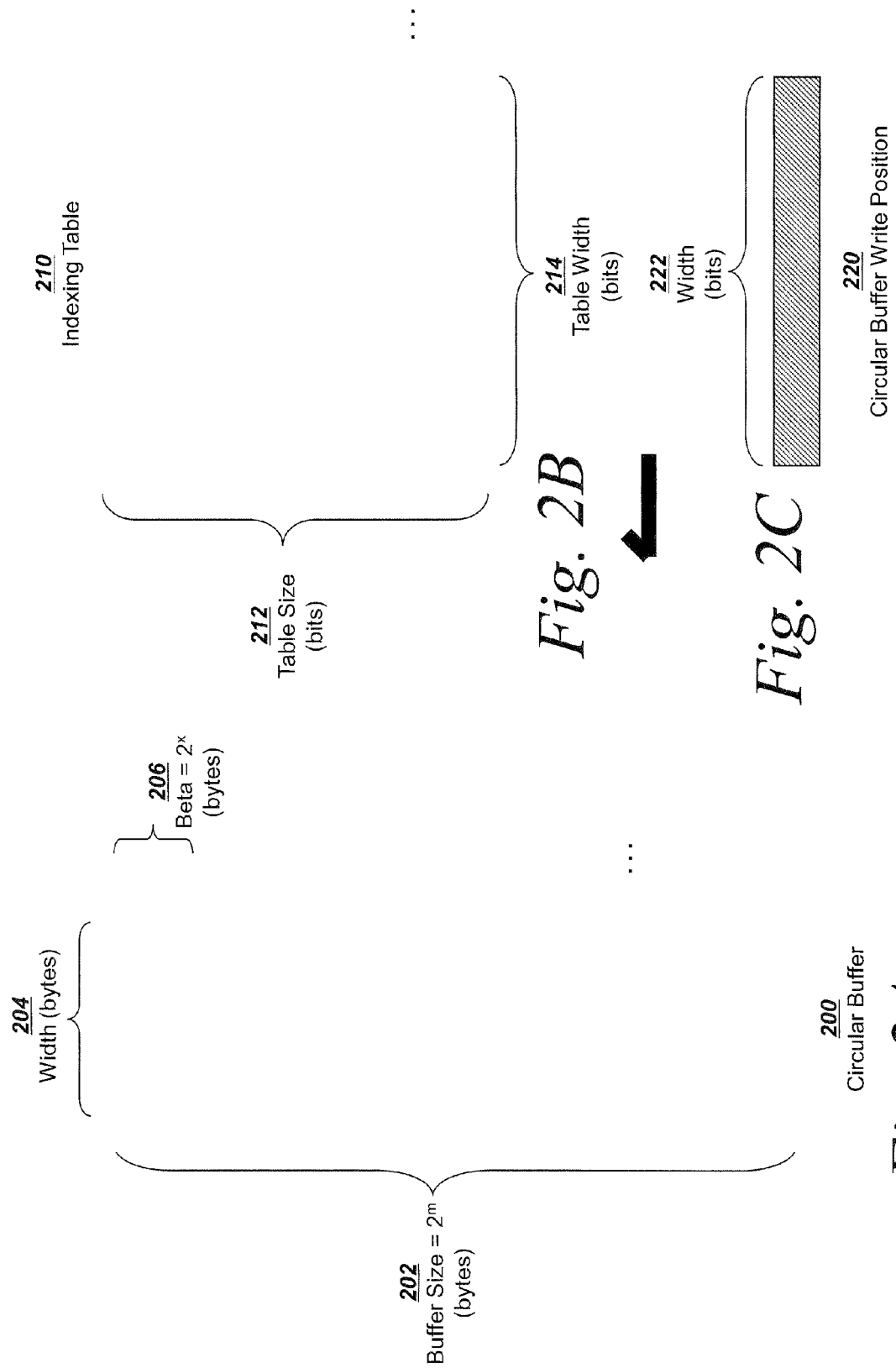
FIG. 2A depicts a circular buffer 200 for use with exemplary embodiments.
FIG. 2B depicts an indexing table 210 for use with exemplary embodiments.
FIG. 2C depicts a circular buffer write position 220 for use with exemplary embodiments.

Exemplary embodiments provide methods and systems for performing compression and decompression on data representations. The data representations may be representations of information having a defined size in units, such as a file, a set of files, a system backup, or an operating system file system. Alternatively, the data representations may be streams of information, such as data streams in a network. The data streams may comprise, for example, data packets, or may comprise a sequence of bytes transmitted in a point-to-point fashion.

Exemplary embodiments provide methods and devices for compressing and/or decompressing the data representations by detecting redundancy in patterns in the data representations. As blocks of data are processed, the processed blocks are placed into a circular buffer at a compressor and indexed based on patterns of data present in the processed blocks. A synchronized circular buffer is also maintained at the decompressor so that the decompressor circular buffer is consistent with the compressor circular buffer. Preferably, the circular buffer has a size in bytes that is a power of 2 (i.e., $2^m$, where m is any integer). The circular buffer is divided into equidistant boundaries, each boundary offset from the previous boundary by an offset $\beta$, measured in bytes. Preferably, $\beta$ is a power of 2 (i.e., $2^x$, where x is any integer).

Using the index, the patterns in the data present in the circular buffer can be identified and retrieved quickly. The index may be, for example, an indexing table that maps a value, such as a hash value, to a location in the circular buffer that corresponds to that value. Preferably, the indexing table maps a hashing value calculated over a unit of data having a size of $\beta$ to a location in the circular buffer corresponding to the hash value. In this way, a pattern in the original data block of size $\beta$ can be quickly and efficiently mapped to a corresponding pattern in the circular buffer. In some exemplary embodiments, the size of the hash value is less than 32 bits.

The compressor may receive an original data block of a data representation. The data block is a division of the data representation. For example, if the data representation is a data stream, an exemplary data block may be a packet. If the data representation is a file, a data block may be a portion of the data representing the file. The size of the data block is finite, but not necessarily fixed, and is assumed to be smaller than the total size of the input.

The compressor may identify one or more matching patterns that each correspond to a pattern in the original data block that matches a pattern in the circular buffer. Each of the matching patterns may be identified, at least in part, by calculating a pattern hashing value on the pattern in the original data block and referencing the indexing table to locate the pattern in the circular buffer. For example, the pattern hashing value may be calculated over a first subset of data in the original data block. The pattern hashing value may then be used as an offset into the indexing table to identify a targeted circular buffer address that may contain the same pattern as the first subset of data. However, due to hashing collisions, the data in the circular buffer at the targeted circular buffer address may not necessarily correspond to the first subset of data. Accordingly, the system looks up a first set of circular buffer data that is present in the circular buffer at the targeted circular buffer address and compares the first set of circular buffer data to the first subset of data to determine whether the first set of circular buffer data matches the first subset of data.

If the first set of circular buffer data matches the first subset of data, the matching pattern may be larger than the first set of circular buffer data and the first subset of data. Accordingly, the circular buffer may be searched forward and backward from the position identified by the targeted circular buffer address in order to determine the largest pattern that is present in both the circular buffer and the data block. To this end, a second set of circular buffer data may be identified that includes the first set of circular buffer data, where the second set of circular buffer data matches a second subset of data in the original data block that includes the first subset of data.

Based on the identified patterns, the compressor may generate an output and transmit the output to the decompressor. The output may include one or more commands identifying each of the matching patterns. If the original data block includes further information in addition to the matching patterns, the output may also include the further information. The output may also include one or more commands identifying data as redundant or non-redundant. In this way, redundant patterns in the original data may be replaced with smaller references to a subset of previously transmitted or processed data.

The synchronized circular buffer may then be updated based on the original data block. The circular buffer should be updated both at the compressor and at the decompressor in order to ensure that the two circular buffers remain synchronized. Updating the circular buffer may include writing the original data block to the circular buffer and, if any overflow information in the original data block extends beyond the end of the circular buffer, writing the overflow information to the beginning of the circular buffer (i.e., wrapping the data back around to the beginning of the circular buffer).

The indexing table may also be updated to reflect the writing of the original data block to the circular buffer. For example, the circular buffer may be divided into equidistant boundaries, each boundary offset from the previous boundary by an offset $\beta$, and the indexing table may map a hashing value calculated over a unit of data having a size of $\beta$ to a location in the circular buffer corresponding to the hash value. In such a case, when data is written to the circular buffer at a particular location (i.e., the write position), and the write position is next to a $\beta$ boundary, the indexing table may be updated by calculating a new information hashing value for the previous $\beta$ bytes in the circular buffer, using the new information hashing value as an index location to the indexing table, and updating the indexing table at the index location with a value corresponding to the position in the circular buffer to which the subset of information is being written divided by $\beta$ (i.e., the write position divided by $2^x$).

When a new block of data is processed, the compressor checks the index to the circular buffer to determine whether the new block of data contains a pattern that is redundant with a pattern in one or more blocks of data that have already been processed. If a redundancy is detected, the compressor informs the decompressor of the redundancy and provides information allowing the decompressor to reconstruct the redundant pattern from the decompressor's circular buffer. In this way, redundant data need not be retransmitted or stored, resulting in smaller transmissions or a smaller (compressed) data representation using less storage space. When employed in a network, the result of the compression methods and devices described above is less network traffic, particularly during periods of peak usages when redundant message data is most prevalent.

Each of these aspects of the application will be described in more detail below with reference to FIGS. 1-12.

FIG. 1 shows a high-level view of a data stream being compressed and then decompressed according to an exemplary embodiment. As depicted in FIG. 1, an input 100 is provided to the compressor system 110. The input 100 may be a data representation of fixed or finite size, such as a file, or may be a data representation of infinite size (or a data representation of a finite, but not fixed or known, size), such as a data stream. If the input 100 is a data representation of finite size, the finite size may be known or unknown. The input 100 may be broken into data blocks of finite size that are buffered in a memory of the compressor system 110 and processed by the compressor system 110. The data blocks may be, for example, packets in a data stream or arbitrary divisions of data in a file.

Figure 8:
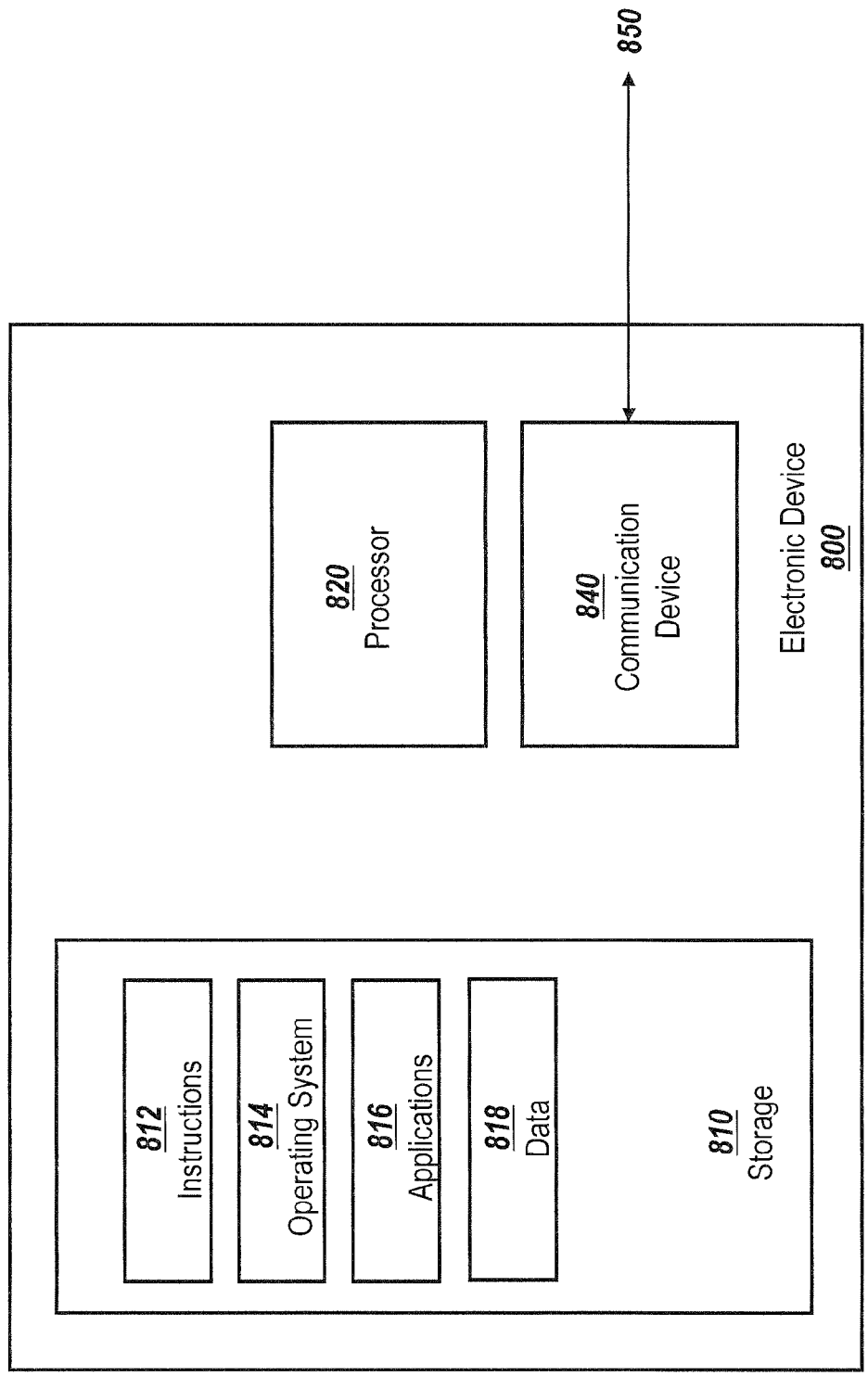
FIG. 8 depicts an exemplary electronic device suitable for use with exemplary embodiments.

The compressor system 110 may be a suitably programmed electronic device, such as the electronic device shown in detail in FIG. 8. The compressor system 110 may include, for example, a memory, processor, and means for data transfer. The compressor system 110 may be a standalone device, such as a custom device that only performs compression, or may be a multifunction device that performs other operations, such as a personal computer, a server, a cellular phone, or a personal digital assistant (PDA). The compressor system 110 may be a part of a larger system that performs other functions, such as functions in a network. For example, the compressor system 110 may be a part of a Node B, Enhanced Node B, Radio Network Controller, Gateway Device, file server, router, switch, or other network device.

The original data block 112 is provided to a compressor 114. The compressor 114 may be, for example, a dedicated processor of the compressor system 110 or may be a shared processor that performs other functions in addition to compression. The compressor 114 takes the original data block 112 as an input and, using an indexing table 116 and a compressor circular buffer 118, the compressor 114 generates as an output a compressed data block 120.

The operation of the compressor 114 will be described in more detail with respect to FIG. 5 below. The structure of the compressor circular buffer 118 and the indexing table 116 are described in more detail with respect to FIGS. 2A and 2B, respectively. Exemplary structures for the compressed data block 120 are described with reference to FIGS. 4A and 4B.

The compressed data block 120 is transmitted as data 122 to the decompressor system 130. The decompressor system 130 may be a suitably programmed electronic device, such as the electronic device shown in detail in FIG. 8. The decompressor system 130 may include, for example, a memory, processor, and means for data transfer. The decompressor system 130 may be a standalone device, such as a custom device that only performs decompression, or may be a multifunction device that performs other operations, such as a personal computer, a server, a cellular phone, or a personal digital assistant (PDA). The decompressor system 130 may be a part of a larger system that performs other functions, such as functions in a network. For example, the decompressor system 130 may be a part of a Node B, Enhanced Node B, Radio Network Controller, Gateway Device, file server, router, switch, or other network device.

The compressed data block 132 is the same as the compressed data block 120 sent from the compressor system 110, and is provided to a decompressor 134. The decompressor 134 may be, for example, a dedicated processor of the decompressor system 130 or may be a shared processor that performs other functions in addition to decompression. The decompressor 134 takes the compressed data block 132 as an input and temporarily buffer the compressed data block 132 in memory. Using a decompressor circular buffer 136, the decompressor 134 generates as an output a representation of the original data block 138. The original data block 138 is the same as the original data block 112 received at the compressor 114.

The operation of the decompressor 134 will be described in more detail with respect to FIG. 6 below. The structure of the decompressor circular buffer 136 may be the same as the structure of the compressor circular buffer 118, and indeed the compressor circular buffer 116 and the decompressor circular buffer 136 are synchronized so that the circular buffer includes the same information when a data block is processed at the compressor system 110 and the decompressor system 130.

An output 140 is generated by the decompressor system 130. The output 140 corresponds to the input 100 provided to the compressor system 110.

As depicted in FIG. 2A, the described compression and decompression methods utilize a circular buffer 200 to store recent original data being processed. The circular buffer 200 is a data structure that uses a single fixed-size buffer as if it were connected end-to-end. That is, when data would otherwise overflow from the end of the circular buffer 200, any overflowing data is redirected and written to the beginning of the circular buffer 200. If data is present at the beginning of the circular buffer 200 when overflowing data is redirected to the beginning of the circular buffer 200, the existing data is overwritten. The data in the circular buffer is broken into smaller chunks at regular boundaries, discussed in more detail below. Each of the smaller "chunks" forms a previously processed pattern to be matched against new patterns in incoming data.

As blocks of data are processed, the processed blocks are placed into the circular buffer 200 at the compressor and indexed based on patterns of data present in the processed blocks. A synchronized circular buffer 200 is also maintained at the decompressor so that the decompressor circular buffer is consistent with the compressor circular buffer.

Preferably, the circular buffer 200 has a size 202 (in bytes) that is a power of 2 (i.e., $2^m$, where m is any integer), both for ease of processing and so that the patterns within the circular buffer can also be easily made a size that is a power of 2. In some embodiments, the circular buffer 200 has a width 204 of 1 byte. A larger size 202 for the circular buffer 200 results in more information being stored in the circular buffer 200, and thus a more extensive history of data blocks and patterns is stored.

The circular buffer is divided by equidistant boundaries, each boundary offset from the previous boundary by an offset β 206, measured in bytes. Preferably, β 206 is a power of 2 (i.e., $2^x$, where x is any integer) for ease of processing and hashing. A smaller β 206 allows for the indexing of smaller patterns in the circular buffer 200, which results in a better chance to find redundancy when a new data block is processed. Some examples of β 206 sizes include 8, 16, 32, or 64 bytes.

The use of a circular buffer 200 allows for faster processing and a smaller memory footprint than traditional compression algorithms, which typically utilize a first-in, first-out (FIFO) queue of data blocks. In a FIFO queue, references and states defining the boundaries between data blocks must be maintained. Because a circular buffer does not need to maintain this information, a circular buffer can be processed faster and has a reduced memory footprint.

The circular buffer 200 is indexed so that patterns in the data present in the circular buffer 200 can be identified and retrieved quickly. The index may be, for example, an indexing table 210 that maps a value, such as a hash value, to a location in the circular buffer 200 that corresponds to that value. An exemplary indexing table 210 for this purpose is depicted in FIG. 2B.

The values for the circular buffer size 202 and the offset β 206 affect the size of the elements stored in the indexing table 210. For example, the table size 212 of the indexing table 210 may be defined to be:

$$2^{m-x}*(m-x) \text{ bits,}$$

where the distance β 206 between boundaries in the circular buffer 200 is defined to be:

$$\beta = 2^x$$

and the total size 202 of the circular buffer 200 is defined to be:

$$2^m.$$

The values for β 206 and the circular buffer size 202 are defined in bytes, while the table size 212 of the indexing table 210 and the width 214 of the indexing table 210 are defined in bits.

By having a proper proportion of the circular buffer size 202 and the indexing table size 212, it is theoretically possible to have one unique index value for every indexed pattern. This makes it possible to have an optimal indexing of the whole circular buffer content in the theoretical limit case. In practice, a 1-to-1 ratio of index values to indexed patterns was found to yield a good compromise between compression performance and memory consumption. That is, having n possible hashing values for indexing n possible patterns was found to be an excellent proportion in theory and practice.

Depending on the application, reducing the index table size (e.g., by increasing the pattern or fingerprint size by 1 bit) may not be beneficial to compression performance, and indeed in some situations may be undesirable. For example, if n patterns are possible in the indexing table, n/2 hashing values may not be sufficient to properly index the patterns.

On the other hand, in some situations increasing the index table size (e.g., by increasing the pattern or fingerprint size by 1 bit) was found to have insignificant benefit on the compression. This is because there is no value to have 'n' possible hashing values for indexing, for example, at most 'n/2' patterns. Further, increasing the index table size by increasing the fingerprint by 1 bit doubles the memory consumption of the indexing table.

For example (returning to FIG. 2A), if the size 202 of the circular buffer 200 is selected to be 4 GB, then m=32 (i.e., $2^{32}$ bytes=4 GB). If the size β 206 is selected to be 16 bytes, then x=4 (i.e., $2^4$=16). Using these proportions, the width 214 of the indexing table 210 is (32−4)=28 bits, and the size 212 of the indexing table 210 is $2^{28}$*28 bits, or about 0.8 GB.

Using these proportions, the width 214 of the indexing table 210 may be suboptimal. For example, the system on which the indexing table 210 is deployed may perform computations more efficiently if the size of the elements in the indexing table 210 is a power of 2 (e.g., 16, 32, or 64 bits). Accordingly, the width of the indexing table 210 may be rounded up. In the example above, where the width 214 of the indexing table 210 was 28 bits, the width 214 may be rounded to 32 bits, and the extra 4 bits may serve as padding, or may be used to carry user specific information or may be used to enhance the performance of the indexing table 210.

Preferably, the indexing table 210 maps a hashing value calculated over a unit of data having a size of β 206 to a location in the circular buffer 200 corresponding to the hash value. That is, the indexing table 210 provides a probabilistic translation from a hash value to corresponding data in the circular buffer 200. In this way, a pattern in the original data block of size β can be quickly and efficiently mapped to a corresponding pattern in the circular buffer 200.

Hashing may be performed by any suitable hashing function known in the art. Most preferably, the hashing function will allow a hashing value to be calculated over new data with reference to previously hashed data; that is, the hashing algorithm should allow for incremental computation. For example, a Rabin fingerprinting scheme may be employed. In a Rabin fingerprint, a message including a number n of bytes t is hashed:

$$\text{Message}_1 = [t_1, t_2, t_3, \ldots, t_n]$$

The Rabin fingerprint RF is defined in terms of a polynomial—for example:

$$RF(\text{Message}_1) = (t_1 p^n + t_2 p^{n-1} + \ldots + t_{n-1} p + t_n) \bmod M,$$

where p and M are constant integers.

Using the Rabin fingerprint as described above, a data representation of length l, where l>n, can be quickly and efficiently indexed because the fingerprint for a subsequent message in the data stream:

$$\text{Message}_2 = [t_2, t_3, t_4, \ldots, t_{n+1}]$$

can be defined in terms of the previous fingerprint (i.e., RF(Message$_1$)) in the following manner:

$$RF(t_{i+1} \ldots t_{n+i}) = (RF(t_i \ldots t_{n+i-1}) - t_i \times p^n) \times p + t_{n+i} \bmod M$$

Preferably, the number n of bytes t that are hashed for each fingerprint is equal to the distance β between boundaries in the circular buffer.

In some exemplary embodiments, the size of the hash value is less than 32 bits. In conventional compression techniques, it is typical to select a large hash value, e.g. greater than 32 bits. This is done out of fear of index collisions whereby two distinct pieces of data have the same hash value. However, in the present systems and methods, a small hash value can be paired with a small β (for example, 8 bytes) in order to multiply the amount of stored hashing value for a given data block size. Although there may be a high rate of collisions among the hashing values, the higher frequency of indexing caused by the small β results in a good probability of finding redundancy with other, valid hashing values.

The selection of a small value for β further allows for more efficient pattern detection. In some conventional pattern-matching techniques, only a deterministic sample of fingerprints in the previously processed data (i.e., previously processed patterns) are indexed in order to save memory. That is, there is a concern in conventional techniques that arises from different competing metrics. If a Rabin fingerprint is calculated for each byte of the previously processed data representations and these representations are all indexed, i.e.:

$$\text{Index} = \{\text{Message}_1 = [t_1, t_2, t_3, \ldots, t_n]; \text{Message}_2 = [t_2, t_3, t_4, \ldots, t_{n+1}]; \ldots; \text{Message}_{l-n+1} = [t_{l-n+1}, \ldots t_l]\}$$

then the set of calculated Rabin footprints includes every pattern in the previously processed messages (in this case, l−n+1 patterns). While indexing all of these different footprints would allow any pattern of length n to be recognized in subsequent messages, this would also require a large indexing table with l−n+1 entries, which has a relatively large memory footprint. Further, searching a large indexing table is computationally expensive. Accordingly, there is a trade-off between the amount of redundancy detected in the data (more redundancy detection results in a better compression ratio) and the memory and processing costs of indexing previously processed patterns.

However, if the hashing values are reflected in the index by length (i.e., every n elements), redundant patterns that are present in subsequently processed data may be missed. That is, if patterns are indexed in the following way:

$$\text{Index} = \{\text{Message}_1 = [t_1, t_2, t_3, \ldots, t_n]; \text{Message}_{n+1} = [t_{n+1}, t_{n+2}, \ldots t_{2n}]; \text{Message}_{2n+1} = [t_{2n+1}, t_{2n+2}, \ldots t_{3n}]; \ldots\}$$

then memory space and processing power is saved because only 1/n messages are indexed and searched. Conventional techniques, however, note that there is a problem with this solution, in that it fails to detect patterns that overlap the different messages in the indexed. Accordingly, the above-described methodology would fail to recognize the following pattern in a newly processed data block:

$$\text{Pattern} = [t_3, t_4, \ldots t_n, t_{n+1}, t_{n+2}]$$

because this particular pattern has not been indexed (note that this pattern would have been indexed if the fingerprint were calculated for each byte). The conventional solution is to hash every pattern in the data representation, incrementing by one byte for each pattern, and selecting a deterministic sample of fingerprints and index only the sample. That is, conventional techniques apply a probabilistic solution in the hope that patterns will be randomly and uniformly distributed.

In some exemplary embodiments of the present compression methodologies, a different approach is taken. Instead of taking a deterministic sample of patterns, the hashing values of the previously processed patterns are reflected in the indexing table by length. That is, when elements in the circular buffer 200 are indexed using the indexing table 210, a hashing value calculation is performed at the regular boundaries of the circular buffer 200 (i.e., for every β$^{th}$ element in the circular buffer 200). In contrast to conventional techniques, these boundaries may be regular, fixed, have a predetermined size, and/or are non-random. Alternatively, only a random subset of the patterns may be hashed in exemplary embodiments (in order to improve speed and efficiency), but hash functions should still be calculated at fixed boundaries in the circular buffer 200 (e.g., a random subset of hashing values calculated at every n$^{th}$ byte in the circular buffer 200; n may be selected to be greater than one).

While the presently described method will not index every conceivable pattern, this issue can be overcome by the selection of a relatively small value for β so that a larger number of relatively small patterns are indexed.

The use of a relatively small β (e.g., every 8 bytes) combined with indexing by length provides numerous advantages over conventional techniques. First, because the patterns are indexed by length, the memory footprint of the indexing table is reduced by at least ((x/m)*100) bits (see the description of FIG. 2A for a discussion of x and m). Further, because the patterns are relatively small, there is a good chance that a redundant pattern will be located in the data even though every possible pattern will not be indexed).

This regular indexing may also result in hashing values which overlap multiple data blocks. In conventional compression techniques, the hashing function is typically performed within the locality of a data block. The present system gives better performance by increasing the chance to find redundancy in the data. Further, using fixed boundaries reduces the size of the indexing table 210, resulting in a smaller memory footprint.

Computations using the indexing table 210 are simplified by the use of a relatively high number of equidistant boundaries in the circular buffer 200 (which can be accomplished by selecting a suitably small value for β). The use of a high number of equidistant boundaries allows the system to build a useful indexing of past known patterns in the circular buffer 200. One factor influencing the choice of β relates to the desired smallest size of the pattern being resolved. For example, a β of 16 will not resolve patterns smaller than 16 bytes. In theory, a smaller β is better for compression performance. However, consideration should be given to the particular application—if, for example, encoding a PF-CMD (described in more detail with respect to FIGS. 4A and 4B) carries a cost of 6 bytes, it is less than optimal to use a β size of 4 bytes or less, because the size of the encodings will overcome any advantage to indexing the smaller patterns.

In conventional compression techniques, the cost of indexing the patterns and the storage footprint are significant. The present system allows for a reduced size of the indexing table 210 because the indexing table 210 can assume that the boundaries in the circular buffer 200 are equidistant.

As depicted in FIG. 2C, the circular buffer write position 220 represents a zero-base index in the circular buffer 200 where the next byte of the original data block will be written. The circular buffer write position 220 is reinitialized to zero when the circular buffer write position 220 exceeds the last position of the circular buffer 200. The circular buffer write position 220 has a width 222 of m bits, where m is used to calculate the size 202 of the circular buffer 200 in the manner described above. The circular buffer write position 220 is used in the data structure update algorithm described in FIG. 3.

Figure 3:
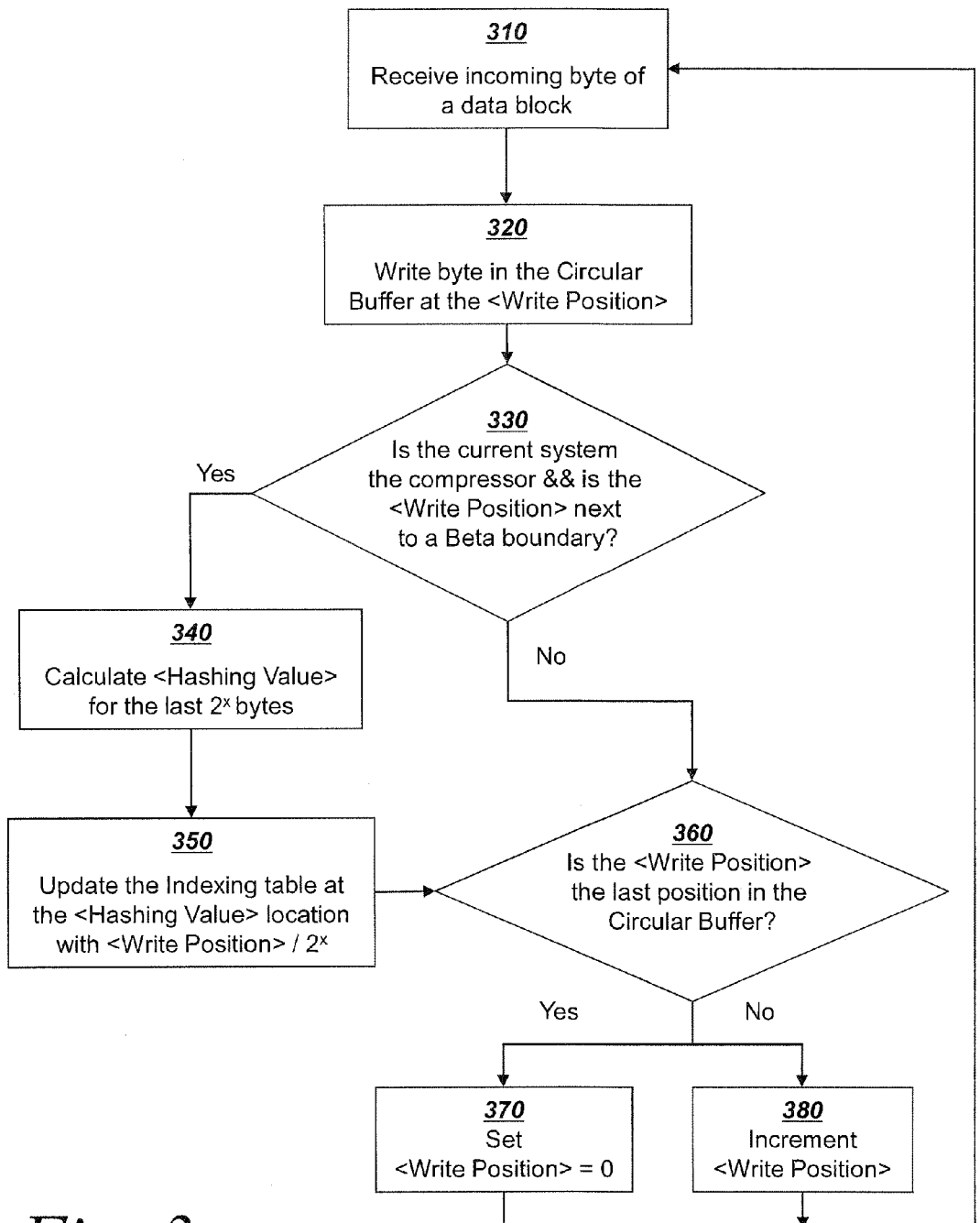
FIG. 3 is a flow chart depicting an exemplary procedure for updating the data structures employed in exemplary embodiments.

The data structure update depicted in FIG. 3 is performed a number of times during compression and decompression. The data structure update is similar for the compressor and decompressor, except that the compressor must maintain an indexing table while the decompressor does not.

To perform a data structure update, the compressor system or decompressor system first receives an incoming byte of a data block at step 310. At step 320, the byte is written in the circular buffer 200 at the circular buffer write position 220.

Optionally, any data that is overwritten at step 320 can first be used to invalidate the corresponding entries in the indexing table 210. This minimizes future unnecessary round-trips to the circular buffer 200 to compare data in an original data block which the compressor believes should be a match for an element in the circular buffer. Whether or not to use the overwritten data to invalidate the entry in the indexing table is a choice made based on the cost of the round-trip to the circular buffer 200 from the indexing table 210 versus the cost of recalculating the hashing value of the retiring data.

At step 330, the system determines whether the indexing table 310 must be updated. An indexing table 210 update need only be performed if the present system is a compressor and if the circular buffer write position 220 is next to a β boundary. If these conditions are satisfied (i.e., an indexing table 210 update should be performed), then the method proceeds to step 340. If the conditions of step 330 are not satisfied (i.e., no indexing table 210 update is necessary), the method proceeds to step 360.

At step 340, a hashing value is calculated for the most recent $2^x$ (i.e., β) bytes (representing the currently detected pattern), as described above with reference to FIG. 2B. At step 350, this hashing value is written to the indexing table 210 at an appropriate index that represents the address of the currently detected pattern in the circular buffer. The index to the indexing table can be calculated, for example, by dividing the calculated hashing value by the circular buffer write position 220 divided by $2^x$ (that is, hashing value/[circular buffer write position/$2^x$]). Processing then proceeds to step 360.

At step 360, it is determined whether the attempt to write the data has overflowed the circular buffer (i.e., whether the circular buffer 200 should loop back around to the beginning). This can be achieved, for example, by comparing the present circular buffer write position 220 to the last position (i.e., the last available memory address) of the circular buffer 200. If the two values are the same, then processing proceeds to step 370, where the circular buffer write position 220 is set to 0. Otherwise, the circular buffer write position 230 is incremented at step 380. Following steps 370 and 380, the system is then ready to receive a new incoming byte of a data block, and proceeds to step 310.

Using the methods described in FIG. 3, an indexing table can quickly be built that allows the compressor to quickly find a pattern corresponding to the hashing value. The hashing value is used as an offset in the indexing table 210, and the element of the table at the offset is itself used as an offset into the circular buffer 200.

One advantage of performing a data structure update according to the methods depicted in FIG. 3 is that the circular buffer 200 and the indexing table 210 do not require any form of initialization, so long as the content of the circular buffer 200 and the write position 220 on the decompressor and compressor are the same before the first data block is processed.

Figure 5:
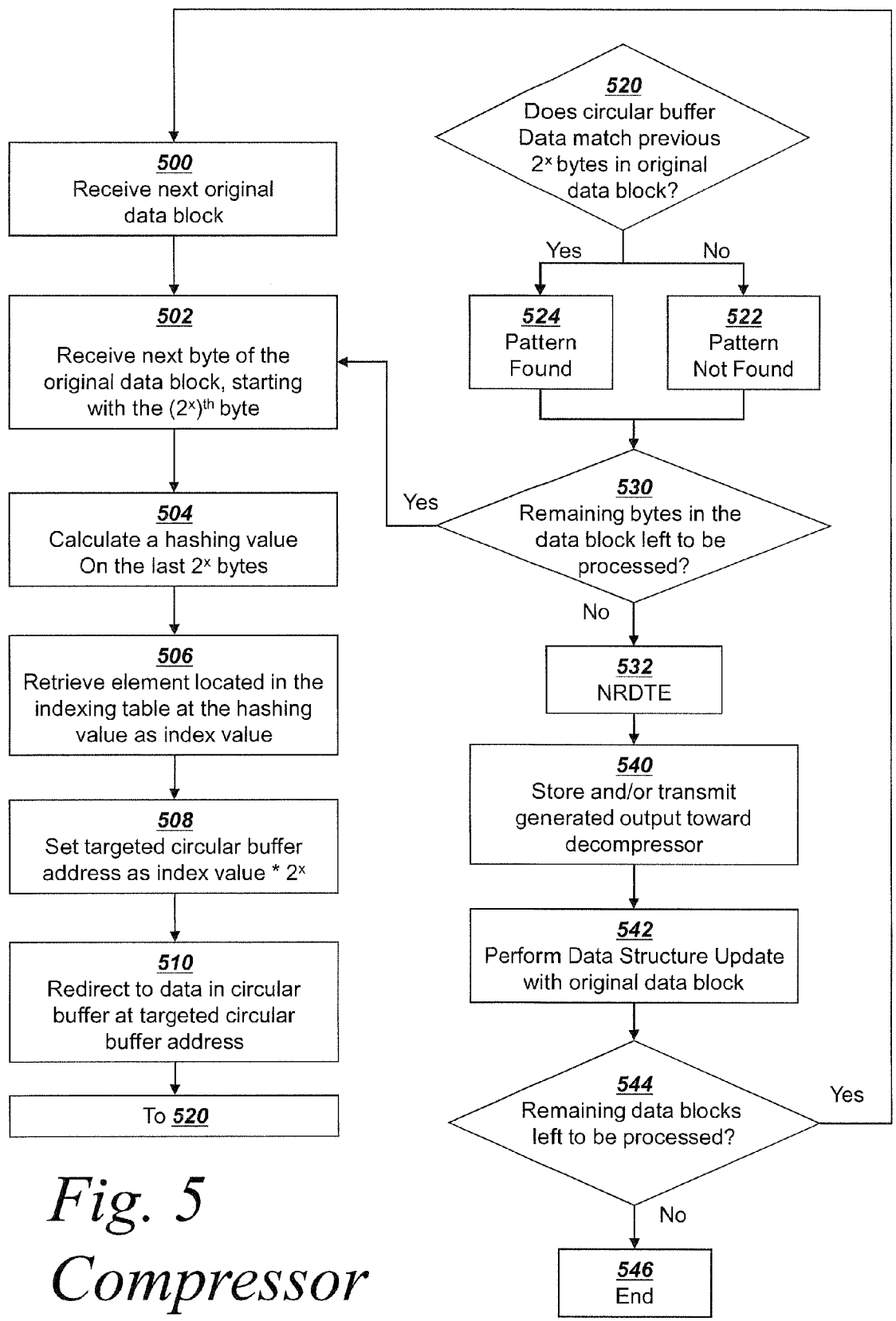
FIG. 5 is a flow chart depicting a procedure employed by a compressor system to compress original blocks of data according to exemplary embodiments.
Figure 6:
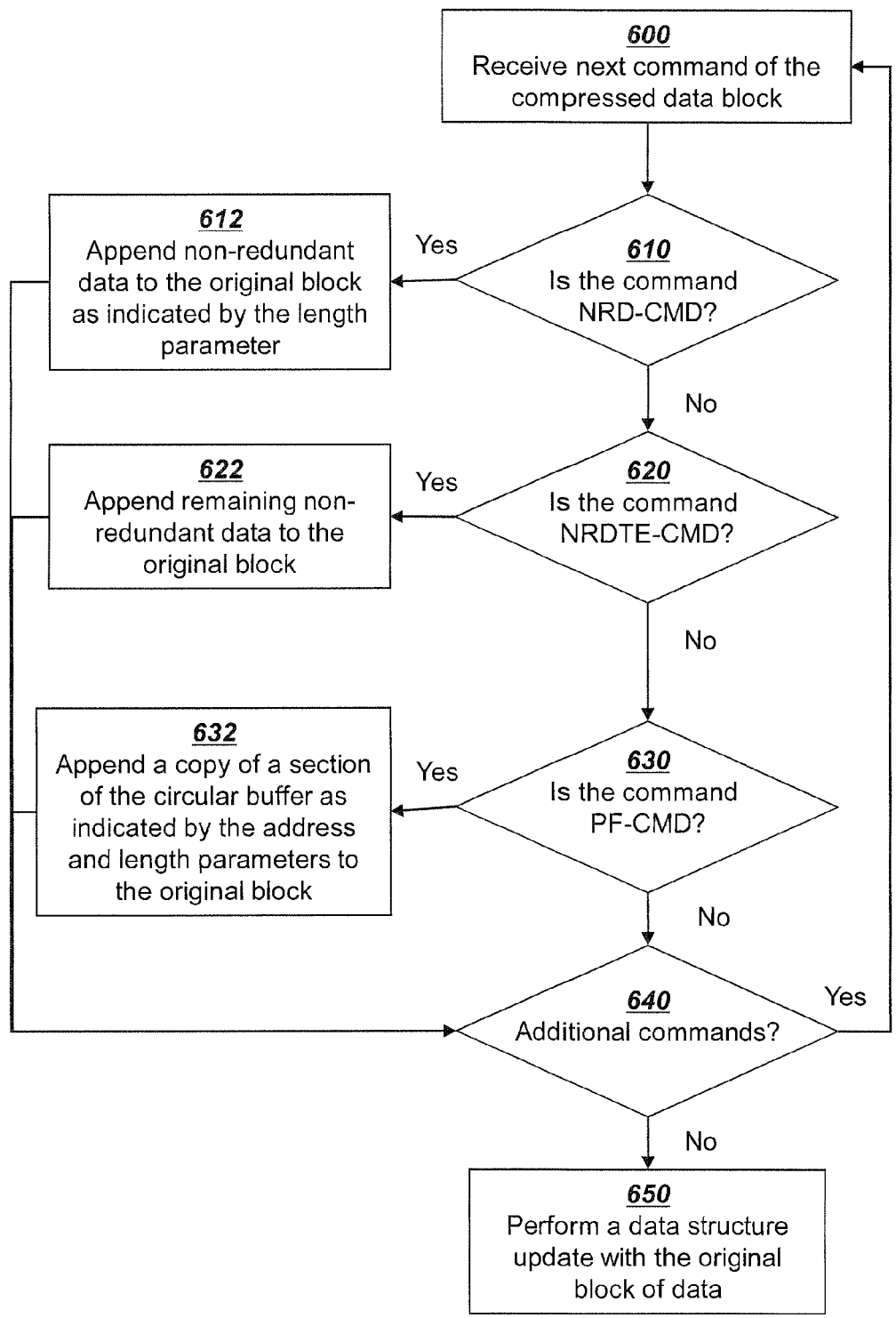
FIG. 6 is a flow chart depicting a procedure employed by a decompressor system to decompress compressed blocks of data according to exemplary embodiments.

The data structure update depicted in FIG. 3 is used in the exemplary compression algorithm shown in FIG. 5 as well as the exemplary decompression algorithm shown in FIG. 6. First, however, it will be helpful to describe the format of the messages that are generated and processed by the exemplary compressor and decompressor.

A high-level abstraction of the compressed message format is shown in FIG. 4A. In the format depicted in FIG. 4A, data that has not been found in the circular buffer is provided in the compressed message, along with one or more commands that identify the data as non-redundant. Redundant data is not included in the compressed message; rather, one or more pattern found commands are provided that indicate where in the synchronized circular buffer 200 the redundant data may be found.

For example, the compressed message begins with a Non-Redundant Data Command 400 (NRD-CMD). The NRD-CMD 400 is generated for every section of the original data block for which no redundancy was found in the circular buffer 200. The NRD-CMD 400 includes an appended length parameter that specifies the size of non-redundant data appended. The following <length> bytes include non-redundant data 402, and another command will follow the non-redundant data 402.

In the compressed message depicted in FIG. 4A, the next two commands Pattern Found commands 404, 406 (PF-CMD). Each PF-CMD 404, 406 describes a section of the original data block for which redundancy was found in the circular buffer. The exemplary PF-CMDs 404, 406 include appended length and location parameters. The location parameter is a zero-base offset in the circular buffer 200 where the redundant data can be found. The length parameter specifies the length of the redundant pattern in the circular buffer 200 and is specified in bytes.

Following PF-CMD 406 in the compressed message depicted in FIG. 4A is a Non-Redundant Data to End command 408 (NRDTE-CMD). The NRDTE-CMD 408 is similar to the NRD-CMD 400, but signifies that no further commands will follow to the end of the message. The NRDTE-CMD 408 takes no appended parameters, because all remaining bytes in the compressed data block can be treated as non-redundant data.

As will be understood by one of ordinary skill in the art, the specific order and format of commands and messages can vary depending on the implementation.

A compressed message format like the one shown in FIG. 4A will be generated by a compression method similar to the exemplary compression method shown in FIG. 5. However, the compression format shown in FIG. 4A is not the only possible compression format. One example of an alternative message format is shown in FIG. 4B.

The compressed message shown in FIG. 4B encodes the same information as the compressed message shown in FIG. 4A. However, in FIG. 4A, the commands are interspersed or mixed with the data (referred to herein as a "sequential command format" because each NRD or NRDTE command is immediately followed by the non-redundant data to which the command refers). In FIG. 4B, in contrast, the commands are agglomerated at the beginning of the compressed data block. Accordingly, the commands NRD-CMD 450, PF-CMDs 452, 454, and NRDTE-CMD 456 are found at the beginning of the message, while the non-redundant data 458, 460 is grouped at the end of the message.

The decompressor may parse the agglomerated message to identify the commands, stopping when the decompressor reaches the NRDTE-CMD 456. The decompressor then knows that the bytes following the NRDTE-CMD 456 to the end of the message constitute the non-redundant data of the message. The original message can be reconstructed using the length parameter of the NRD-CMD 450, the order of the commands, and the information in the circular buffer. The NRD-CMD 450 includes a length parameter. The first <length> bytes of non-redundant data, corresponding to non-redundant data 458 in FIG. 4B, are associated with NRD-CMD 450. When the decompressor reaches a PF-CMD 452 or 454, the decompressor checks the circular buffer using the <length> and <location> parameters associated with each PF-CMD 452, 454 in order to reconstruct the redundant data. When the decompressor reaches the NRDTE-CMD 456, the non-redundant data 458 will have been accounted for by the initial NRD-CMD 450, and so the remaining bytes in the message (non-redundant data 460) are associated with the NRDTE-CMD 456.

The agglomerated command format depicted in FIG. 4B may be useful to provide a smaller compressed output message, due to limited grammar base redundancy. That is, some embodiments of the present compression methods are good at quickly resolving large redundancies (e.g., larger than β), but are not good at resolving redundancies for traffic seen for the very first time or patterns of size less than β. Consequently, after the compression methods finished compressing a message, further traditional link compression (such as, for example, ZLIB) may be performed on the output represented in FIG. 4B. The link compression context is also synchronized from one data block to another at both the compressor and decompressor.

One advantage to the representation used in FIG. 4B is that it makes it simpler to do two independent link compressions with two different contexts or two different subsequent compression algorithms. For example, one context may be used for the commands, and one context may be used for non-redundant data. The redundancy of patterns is high for the commands, because the compression algorithm uses a limited grammar. Further, by not interlacing the commands with the non-redundant data, there is a better chance that further link compression can resolve more redundancy in the original data.

The operation of the decompressor will be further described with reference to FIG. 6. First, operation of the compressor is described with reference to FIGS. 5, 5A, and 5B.

Compression algorithms may be lossless, meaning that compressed data may be decompressed to exactly reproduce the original data, or may be lossy, meaning that the original data is typically not fully recoverable. Lossy compression typically results in a lower quality final representation, but can also usually compress the data to a greater extent. An example of lossless compression is the ZIP file format, while examples of lossy compression include the JPEG and MP3 file formats. FIG. 5 describes a lossless compression algorithm.

As shown in FIG. 5, operation of the compressor system begins at step 500, when an original data block is received at the compressor system. As noted above, a data block is a portion of a data representation. For example, a data representation may be a file and a data block may be a number of bytes selected from the file. Alternatively, a data representation may be a data stream, and a data block may be a packet in the data stream. One of ordinary skill in the art will understand that a data representation may be any representation of data having a finite or infinite size, and a data block may be any portion of the data representation, including an arbitrarily-sized logical division of a data representation.

A data block is typically divided into bytes, and if so, each byte is processed by the compressor system, starting with the $(2^x)^{th}$ byte, where $\beta=2^x$. Accordingly, at step 502, the next byte of the data block is received by the compressor system for processing. For example, a data block made up of a number n of bytes t, where n>β, may be represented as:

$$\{t_1, t_2, t_3, \ldots, t_\beta, t_{\beta+1}, \ldots, t_n\}$$

At step 502, the first byte to be received for processing is $t_\beta$. As described below, processing will continue for each byte $t_{\beta+1}, \ldots, t_n$.

At step 504, a hashing value is calculated over the previous $2^x$ bytes in the original data block, ending with the byte received in step 502. For example, if the byte received at step 502 is $t_\beta$, a hashing value HV is calculated using a hashing function HF:

$$HV = HF(\{t_1, t_2, t_3, \ldots, t_\beta\}).$$

The hashing function may be any suitable hashing function, as described above with reference to FIG. 2B. If the byte being processed is not the first byte processed for the original data block (e.g., the byte being processed is any of $t_{\beta+1}, \ldots, t_n$), and the hashing function employed supports incremental computation as discussed above, then the hashing value may be computed based on a previously calculated hashing value. An example of incremental computation for a hashing function is discussed above with respect to FIG. 2B.

The hashing value represents an identifier or fingerprint for the pattern serving as an input to the hashing function. Because previously processed data has been similarly hashed and indexed in the indexing table 210 (see, e.g., the data structure update of FIG. 3), the indexing table 210 allows hash values for currently processed patterns to be quickly and efficiently matched to a location in the circular buffer that includes the pattern. Accordingly, at step 506, the compressor system retrieves the element located in the indexing table 210 at the hashing value calculated in step 504. The retrieved element will be used as an index value for determining a targeted address in the circular buffer 200 where the pattern may exist.

At step 508, the compressor system calculates the targeted address in the circular buffer 200 by multiplying the index value obtained in step 506 by $2^x$ (i.e., $\beta$). At step 510, the compressor system redirects to data in the circular buffer 200 at the targeted circular buffer address and retrieves the pattern stored at the targeted circular buffer address (the pattern will be of length $\beta$).

If the $\beta$ bytes of data do not form a redundant pattern, then the element at the index value in the indexing table 210 may be empty, or may point to an unrelated portion of the circular buffer. Further, due to the possibility of hashing collisions, it cannot be assumed that the pattern in the original data block matches the pattern in the circular buffer 200 simply because the two patterns share a common hash value. Accordingly, at step 520, the patterns are compared. That is, the compressor system determines whether the $\beta$ bytes stored in the circular buffer 200 at the targeted circular buffer address match the $\beta$ bytes over which the hashing value was calculated at step 504.

If the two patterns do not match, processing proceeds to step 522. If the two patterns are determined to match, processing proceeds to step 524. At step 524, it has been determined that a redundant pattern has been identified by the compressor system, and an appropriate sequence of steps is carried out to identify the full matching pattern and output information related to the pattern into a compressed message. In contrast, at step 522, a pattern has not been found, meaning that the previously $\beta$ bytes of the original data block include non-redundant data, and an appropriate sequence of steps is carried out to append the non-redundant data to the compressed message. The pattern found operation 524 and the pattern not found operation 522 are described in detail with reference to FIG. 5A, below.

Regardless of whether a redundant pattern is identified in step 520, operation proceeds to step 530 following either the pattern found operation 524 or the pattern not found operation 522. At step 530, it is determined whether there are remaining bytes left in the data block for further processing. If the byte received by the compressor system at step 502 was the final byte of the original data block (in the above example, the $t_n^{th}$ byte), then operation proceeds to step 532. If more bytes of the original data block remain to be processed, operation returns to step 502 and the next byte of data is received at the compressor system.

If no remaining bytes exist to be processed and operation proceeds to step 532, a NRDTE-CMD is issued and non-redundant data is appended to the compressed message. Step 532 is described in more detail with reference to FIG. 5B, below.

Operation then proceeds to step 540. At step 540, is has been determined that no further bytes of data from the original data block remain to be processed, and the compressed message has been fully assembled. Accordingly, the compressor system stores the compressed message and/or transmits the compressed message toward the decompressor.

At step 542, the compressor structure performs a data structure update, as described in FIG. 3, using the original data block. Once the data structure update is completed, the compressor system determines whether there are remaining data blocks left to be processed (step 544). If the answer is yes, meaning that more data blocks exist for processing, then operation returns to step 500 and the procedure is repeated for the next data block. If, on the other hand, there are no further data blocks in the data representation, operation proceeds to step 546 and the algorithm terminates.

Using the methods shown in FIG. 5, the compressor system generates compressed messages that may include three different commands (PF-CMD, NRD-CMD, and NRDTE-CMD) and non-redundant data. The commands and data are appended to the compressed message (which forms the generated output of the compressor system) following steps 520 and 530. Steps 520, 522, and 524 are shown in more detail in FIG. 5A, while steps 530, 502, and 532 are shown in more detail in FIG. 5B.

As depicted in FIG. 5A, at step 520 the compressor system determines whether the circular buffer data at the targeted circular buffer address matches the previous $2^x$ bytes of data.

If the two patterns do not match, operation proceeds to step 522. As a part of step 522, at step 550, the compressor system memorizes any non-matching bytes, for example by storing the non-matching bytes in a temporary buffer. The memorized bytes are stored for an eventual NRD-CMD or NRDTE-CMD.

On the other hand, if the two patterns match at step 520, operation proceeds to step 524. As a part of step 524, at step 560, the circular buffer 200 is searched backwards and forwards from the targeted circular buffer address to identify a common portion of the data. This operation is performed because, while a pattern has been detected, the detected pattern may not be the largest matching pattern between the original data block and the circular buffer 200.

For example, assume that x=2, and so $\beta=2^2=4$. Further, consider a message having a number n of bytes t, in the following order:

$$\{t_1, t_2, t_3, \ldots, t_\beta, t_{\beta+1}, \ldots, t_n\}$$

Assume that the circular buffer includes the following patterns, stored in order:

$$\text{Pattern1} = \{t_3, t_1, t_2, t_5\}$$

$$\text{Pattern2} = \{t_6, t_7, t_8, t_9\}$$

$$\text{Pattern3} = \{t_{10}, t_{11}, t_4, t_6\}$$

Accordingly, the circular buffer includes:

$$\{t_3, t_1, t_2, t_5, t_6, t_7, t_8, t_9, t_{10}, t_{11}, t_4, t_6\}$$

The first byte of the original data block received at step 502 will be $t_4$, because $2^x=4$. Accordingly, at step 504, a hashing value is calculated over the pattern $\{t_1, t_2, t_3, t_4\}$. No matching pattern in the buffer is identified.

Operation continues until the compressor system receives, at step 502, byte $t_9$ from the original block. Accordingly, at step 504, the pattern $\{t_6, t_7, t_8, t_9\}$ is hashed. At this point, operation has proceeded through the loop depicted in FIG. 5 several times, and the temporary buffer for storing non-redundant data (updated each time through the loop at step 550)

now includes $\{t_1, t_2, t_3, t_4, t_5\}$. When the new pattern $\{t_6, t_7, t_8, t_9\}$ is hashed, a match with Pattern2 in the circular buffer 200 is identified.

However, $\{t_6, t_7, t_8, t_9\}$ is not the largest matching pattern between the circular buffer 200 and the original data block. A larger matching pattern extends backwards in the circular buffer 200 from the targeted circular buffer address (the beginning of Pattern2) and forwards from the targeted circular buffer address. By searching backwards and forwards in the circular buffer, the compressor system can identify the largest matching pattern, which in this case is $\{t_5, t_6, t_7, t_8, t_9, t_{10}, t_{11}\}$ and overlaps Pattern1, Pattern2, and Pattern3.

At step 570, the compressor system checks to see whether a prepended portion of the original data block is in the circular buffer. This step is included to account for any data in the temporary buffer for non-redundant data updated at step 550. For example, while $t_5$ is a part of the matching pattern identified at step 560, $\{t_1, t_2, t_3, t_4\}$ are not. Accordingly, the system must account for these non-redundant data portions. If the determination at step 570 is "Yes," meaning that all of the previously-identified non-redundant data has been accounted for in the presently matched pattern, operation proceeds directly to step 574. If the determination at step 570 is "No," operation proceeds to step 572, where the non-redundant data is accounted for in the compressed message by issuing a NRD-CMD followed by any non-redundant bytes in the temporary buffer for non-redundant data. The temporary buffer may then be cleared, and operation proceeds to step 574.

At step 574, a PF-CMD is issued for the portion of the original data block found to be identical. The compressor system provides the offset into the circular buffer where the pattern may be found and the length of the pattern so that the decompressor can locate the pattern in the decompressor circular buffer.

At step 576, data block processing is moved to the next byte found to be different from the circular buffer. In the above example, the most recent byte addressed at step 502 was $t_9$; however, by searching backwards and forwards in the circular buffer, the compressor system has identified a redundancy that extends to byte $t_{11}$ in the original data block. Accordingly, there is no need to process bytes $t_{10}$ and $t_{11}$, and data block processing is moved to byte $t_{12}$.

Figure 5B:
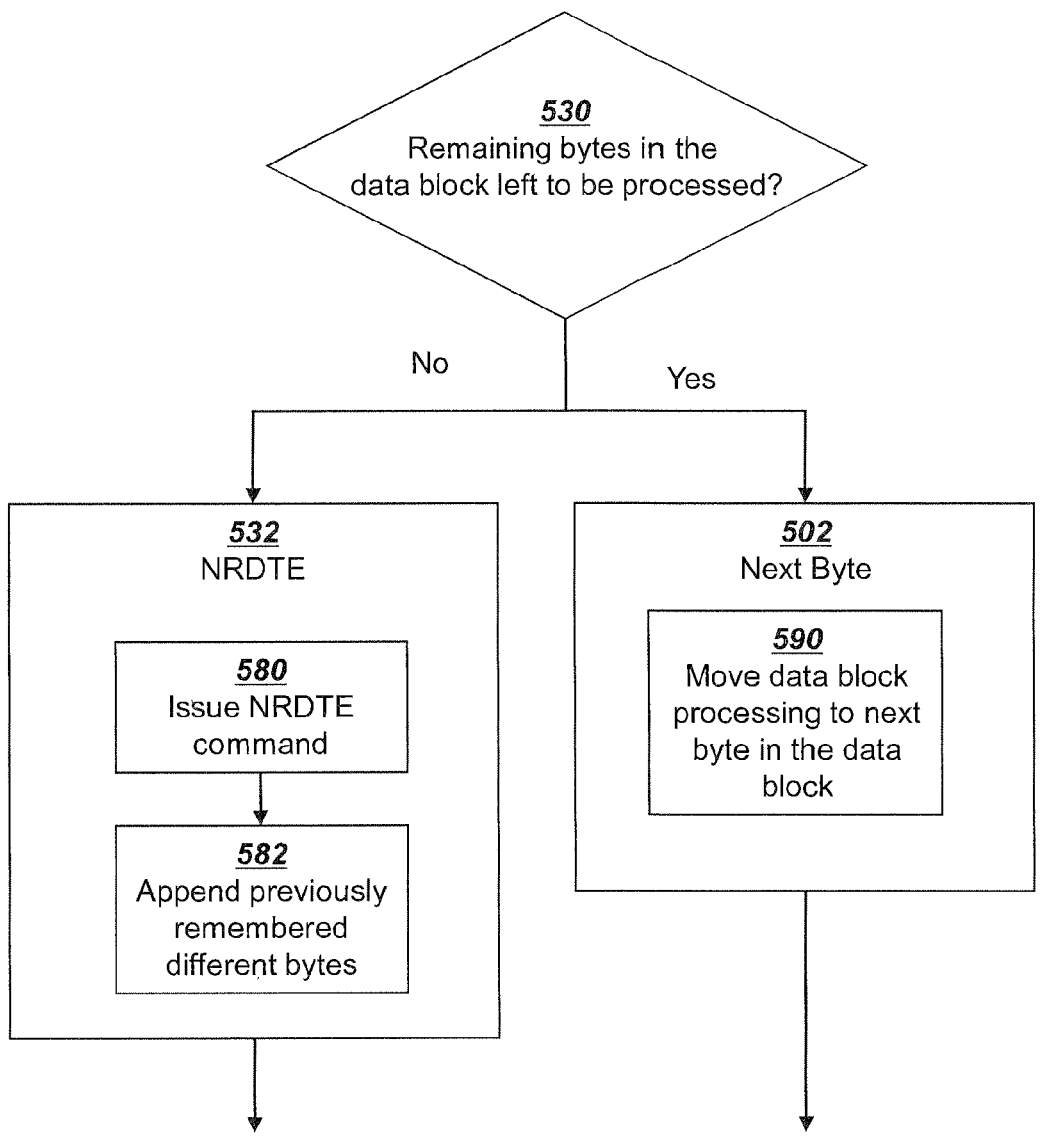
FIG. 5B is a flow chart depicting the NRDTE block 532 and the Next Byte block 502 of FIG. 5 in more detail.

When processing has finished and there are no remaining blocks to be processed, the determination at step 530 of FIG. 5 is "No." As shown in FIG. 5B, processing then proceeds to step 532, where an NRDTE-CMD is issued at step 580. The NRDTE-CMD signifies that the remaining data in the compressed message is non-redundant. Accordingly, at step 582, the compressor system appends any previously remembered bytes (i.e., bytes stored in the temporary buffer for non-redundant data, which is updated at step 550) to the compressed message.

On the other hand, if there are bytes remaining to be processed at step 530, operation proceeds back to step 502, where data block processing is moved to the next byte in the data block according to step 590.

The compression methodology shown in FIG. 5 takes a sequential (i.e., byte-by-byte) approach to the resolution of redundancy. Higher compression may be achieved by resolving a data block compression with the union of all its redundant sections, instead of resolving the redundancy of a given byte by always using the first redundancy found in the circular buffer. The choice of whether to utilize the union of redundant sections versus the first redundancy found is a compromise between speed and compression efficiency.

More specifically, higher compression may be achieved by attempting to resolve every pattern match for every byte starting from the $(2^x)^{th}$ byte to the last byte in the data block. In the exemplary sequential implementation described above, once a pattern is found the identified pattern is assumed to be a "good match" and a PF-CMD output is produced immediately. The procedure is repeated for the next byte, and so on until the end of the data block.

Sometimes, it might be beneficial to temporarily hold producing the PF-CMD because a better match could be find later in the circular buffer which solves a larger portion of the data block at once. This approach is a parallel, as opposed to a sequential, approach. In a parallel approach, the algorithm searches the circular buffer to locate all possible patterns, and then determines the smallest set of PF-CMDs that resolve the maximum number of bytes. With the parallel algorithm, the pattern-finding portion of the algorithm can easily be run in parallel at a byte granularity Such an algorithm may be too processing intensive, depending on the application. It has been found that sequential processing yields a good balance between optimal compression and processing requirements.

Because the compressor refers to past patterns only by offset and length into the synchronized circular buffer, the presently described methods allow for a low-complexity decompressor. Basically, the decompressor receives the incoming compressed messages, parses the commands, and refers to the synchronized circular buffer to regenerate the original message. The decompressor output, when finalized, will match the original data block. Operation of the decompressor is described in detail with respect to FIG. 6.

At step 600, the decompressor system receives the next command of the compressed data block. This command may be, for example, PF-CMD, NRD-CMD, or NRDTE-CMD.

At step 610, the decompressor system determines whether the command is an NRD-CMD. If so, operation proceeds to step 612, where the non-redundant data which follows the NRD-CMD in the compressed message is appended to the decompressor output. The NRD-CMD includes a length parameter instructing the decompressor system how many bytes of non-redundant data follow the NRD-CMD. Operation then proceeds to step 640.

If the determination at step 610 is "No," operation proceeds to step 620, where the decompressor determines whether the command is NRDTE-CMD. If so, operation proceeds to step 622, where the remaining non-redundant data is appended to the decompressor output. Because NRDTE-CMD signifies that the last command has been received, all of the remaining data in the compressed message is treated as non-redundant data. Operation then proceeds to step 640.

If the determination at step 620 is "No," operation proceeds to step 630, where the decompressor determines whether the command is PF-CMD. If so, operation proceeds to step 632, where a copy of a section of the decompressor circular buffer is appended to the decompressor output. The PF-CMD includes an address parameter and a length parameter which inform the decompressor where in the circular buffer the matching pattern is located and how long the matching pattern is, respectively. Operation then proceeds to step 640.

If the determination at step 630 is "No," operation proceeds to step 640. Optionally, an error message may be thrown, because an unidentified command has been received. That is, the decompressor expects to see only NRD-CMD, NRDTE-CMD, or PF-CMD, but has now received a command which is not any of these.

At step 640, the decompressor determines whether any additional commands remain in the compressed message. If the answer at step 640 is "Yes," operation proceeds back to step 600 and the loop is repeated for the new command. If the answer at step 640 is "No," the full original data block has been recreated. Operation proceeds to step 650, where a data structure update is performed using the original block of data (see FIG. 3), and the decompressor forwards the reconstructed original data block as output.

Figures 7A, 7B:
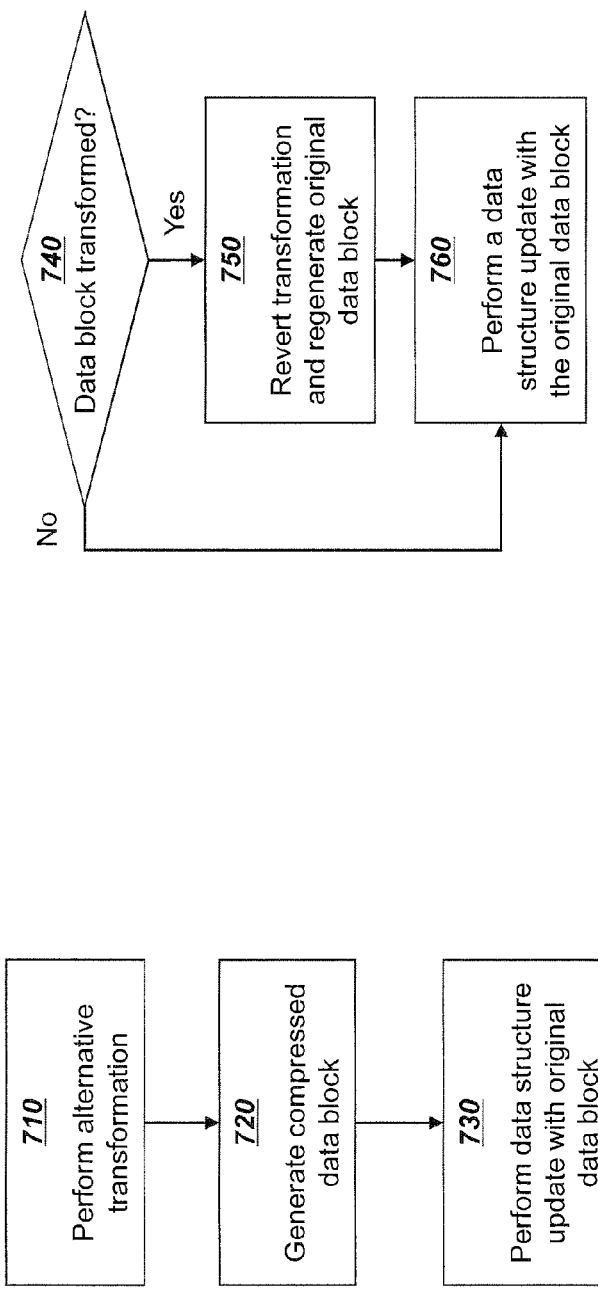
FIG. 7A is a flowchart depicting an exemplary procedure for performing alternative data transformations to an original data block in conjunction with the compression methods described herein.
FIG. 7B is a flowchart depicting an exemplary procedure for decompressing data blocks that have undergone alternative data transformations as depicted in FIG. 7A.

In addition to compression and decompression, the methods described herein facilitate co-existence with other data transformations, as shown in FIGS. 7A and 7B, so long as the alternate data transformations are lossless. Alternate data transformations may include, for example, compression algorithms in addition to the compression algorithms described herein, transformations, and other forms of data processing. The alternate data transformation may be a nil transformation that simply transmits the original data block. Additional link compression may also be performed, such as the DEFLATE algorithm (RFC1951). Optionally, the link compression result may be used for the output only if it results in a smaller data block.

The advantage to performing additional compression (e.g., on top of the presently described methods) is that the present compression algorithm performs best once a history has been built into the circular buffer. An alternative algorithm may be used to achieve some level of compression until updates to the circular buffer and indexing table have built such a history.

As shown in FIG. 7A, when an alternate transformation is to be applied to a data block, the alternate transformation occurs first, at step 710. At step 720, the compressor generates a compressed data block on the transformed data, and a data structure update is performed (FIG. 3) at step 730 using the original data block.

When a compressed data block is received at the decompressor (FIG. 7B), the decompressor first determines, at step 740, whether the data block has been subjected to an alternate transformation. If so, the decompressor reverts the alternate transformation at step 750, regenerates the original data block, and operation proceeds to step 760. If not, operation proceeds directly to step 760. At step 760, a data structure update is performed (FIG. 3) using the original data block.

As noted above, the compressor system and decompressor system may be employed in an electronic device. FIG. 8 depicts an electronic device 800 suitable for use in exemplary embodiments. The electronic device 800 may contain a storage 810 for storing instructions 812 to be executed by one or more processors 820, such as a microprocessor, ASIC, FPGA, or a controller. The instructions 812 may be stored on one or more electronic device readable storage media. Examples of electronic device-readable storage media include, but are not limited to, RAM, ROM, magnetic storage media, or optical storage media, such as CDs or DVDs. Instructions 812 may cause the processor 820 to perform a series of steps described in detail herein. The instructions 812 may be in any form that describes how to perform these steps. For example, the instructions may be uncompiled code in any suitable programming language, compiled code, assembly language instructions, or any other type of instructions.

The storage 810 may also store an operating system 814 for operating the electronic device 800. The storage 810 may store additional applications 816 for providing additional functionality, as well as data 818 for use by the electronic device 800 or another device.

The electronic device 800 may have a communication device 830 for communicating with a communication network 850. The communication device 830 may be, for example, a modem, an Ethernet connection, a fiber optic connection, a radio antenna, or any suitable means for communicating with a network.

The electronic device 800 may proxy a transport protocol in an access network. For example, if the network is a UMTS network, the electronic device 800 may proxy an Iu-B or an Iu-PS protocol. However, the present disclosure is not limited to implementation in a UMTS network, and may be deployed in any suitable communication network, or without the use of a communication network. The transport protocol employed will vary based on the type of communication network utilized.

Figure 9:
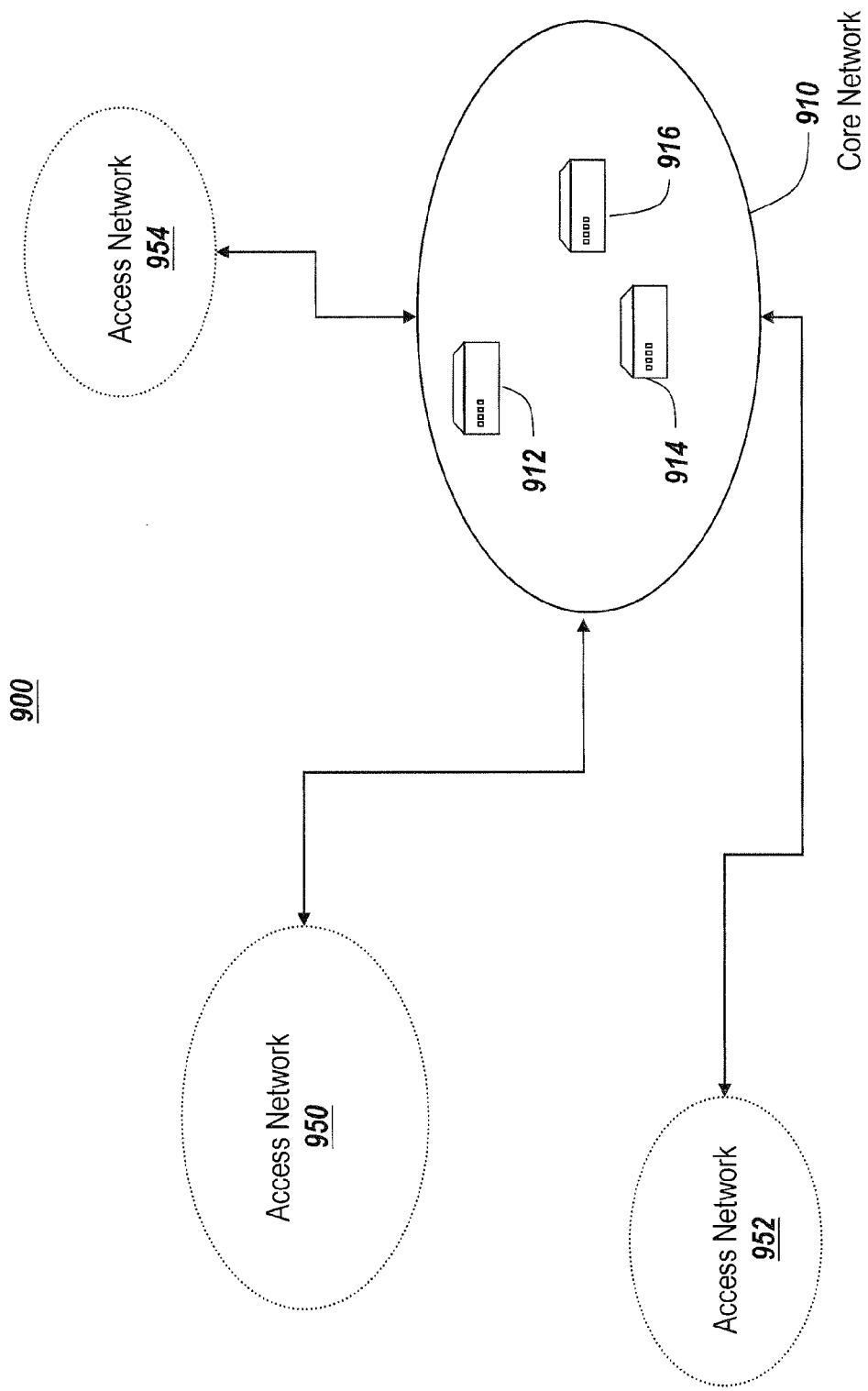
FIG. 9 graphically depicts a communication network suitable for use with exemplary embodiments.

FIG. 9 depicts a communication network 900 suitable for use in exemplary embodiments. The communication network 900 may be a wireless network, or a wired network, or a combination or wireless and wired networks. The communication network 900 may be, for example, a Universal Mobile Telecommunications System (UMTS) network. For clarity, some exemplary embodiments are described herein with reference to a UMTS network. However, one skilled in the art will recognize that the functionality described herein is equally applicable in different types of communication networks, such as a network utilizing a WiFi framework, a WCDMA framework, a CDMA framework, a WiMax framework an LTE framework, or a UMB framework, among others.

The communication network may include a core network 910 and access networks 950, 952 and 954. Those skilled in the art will appreciate that the depiction of the communication network 900 in FIG. 9 is intended to be merely illustrative and not limiting. Other network configurations are possible in practicing the present invention. For example, the communication network may be fully distributed so as to have no core network, or may have more than one core network. The communication network may also have more or fewer access networks than the communication network 900 depicted in FIG. 9. Some devices depicted in the communication network in the present figures may not be present in other communication networks, while other devices not depicted in the figures may be present.

The core network 910 may include one or more core services platforms 912, 914, 916. The core services platforms 912, 914, 916 may provide services within the core network, such as (but not limited to) fetching data from a storage repository or routing data throughout communications network 900. A core services platform 912, 914, 916 can take a number of forms, depending on the services to be provided. For example, core services platforms 912, 914, 916 may be servers within core network 910. Alternatively, a core services platform 912, 914, 916 may be a switch, a router, a server (such as a file server or a mail server), a network bridge, a network hub, or a repeater.

Each access network 950, 952 and 954 serves as a point of contact with the communication network 900 for users, and connects subscribers with service providers. Examples of access networks include, but are not limited to, the UMTS Terrestrial Radio Access Network (UTRAN), the GSM Radio Access Network (GRAN), and the GSM Edge Radio Access Network (GERAN).

The compression methods described herein may optionally be deployed on a bypass device or inline device located in the network, as described in more detail below with reference to FIG. 10. The bypass device may receive and transmit data in order to bypass one or more devices in the network. The bypass device may compress data and forward the compressed data to a device downstream of the bypassed network devices. A remote node may be provided downstream of the bypassed devices to decompress the data and forward the decompressed data towards its final destination. Using the bypass device and the remote node may allow the compression methods described herein to be used in a network without requiring that existing network devices be replaced or reprogrammed.

Figure 10:
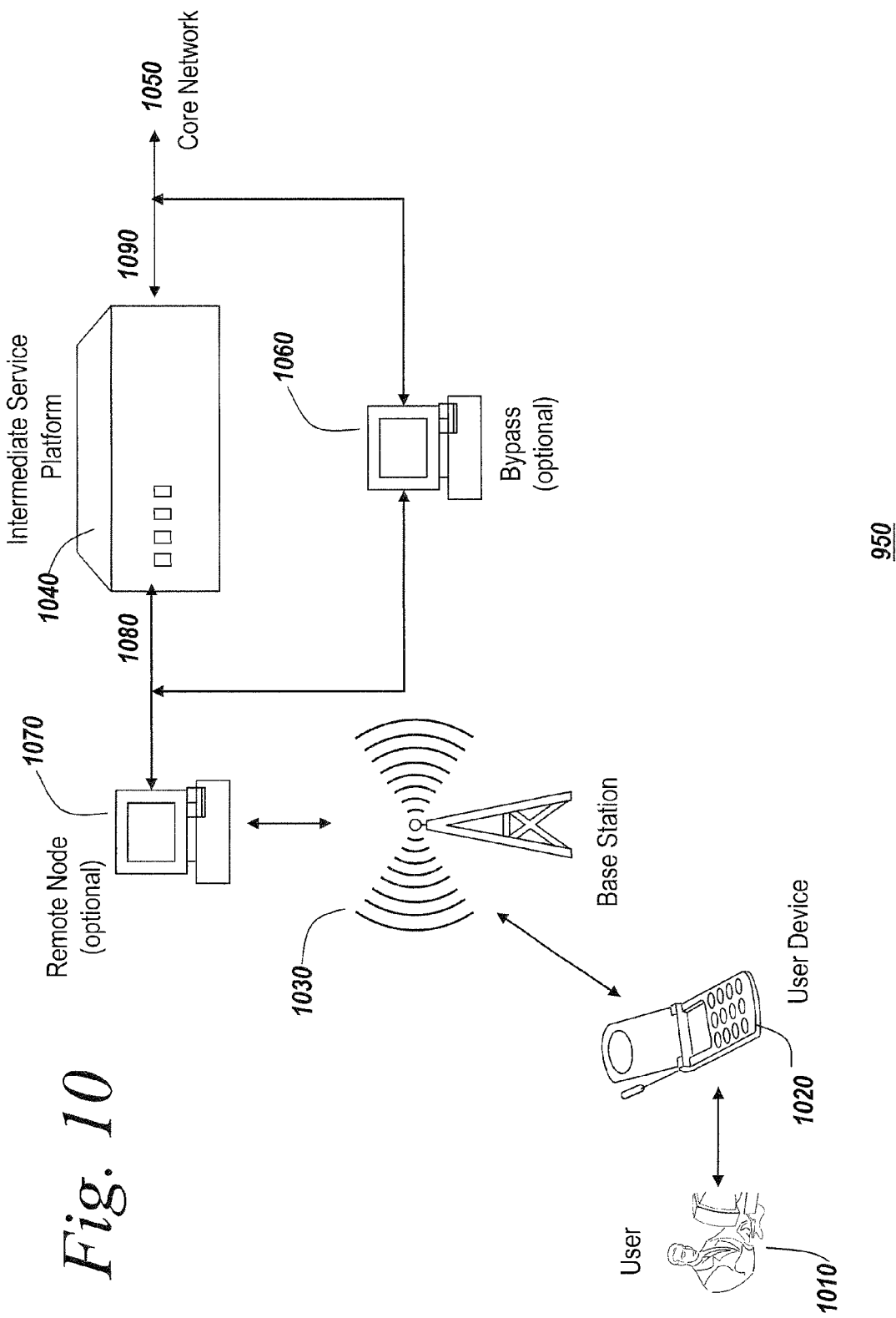
FIG. 10 depicts the access network 950 of FIG. 9 in more detail.

FIG. 10 depicts exemplary access network 950 in more detail. A user 1010 using a user device 1020 may interact with the access network 950 via a communications device, such as a modem, fiber optic connection, or a transmitter and receiver for radio communication. The user device 1020 may be, for example, but is not limited to, a computing device, a personal digital assistant, a cellular phone, or a Global Positioning System device. The user device 1020 may send and receive data through a base station 1030 located in the access network 950. The base station 1030 may be, for example, a gateway, a cell tower, a Node B, or an Enhanced Node B.

Any of the devices in the network 900 may send or receive data. Data includes information sent from one device to another in any format, including analog data, digital data, or a combination of analog and digital data. The data may be transmitted in discrete data packets, or in a non-packetized format, such as a continuous series of bytes, characters, or bits.

Data may be sent through the access network using one or more data channels. A data channel, sometimes referred to as a data carrier, is a transmission medium that carries data from one point to another. Data channels include discrete logical fixed channels configured in a network. A data channel may be physical and tangible, such as a wire or fiber optic link, or may be intangible, such as a radio wave at a particular frequency or a wavelength of light. Data channels also include virtual or logical channels, such as software ports in a computer.

Data within a data channel may travel through the communication network on one or more data streams. A data stream, sometimes referred to as a data flow, is a sequence of coherent signals used to transmit or receive information that is in transmission. Data streams include information carried in a data channel. As used herein, "downstream" in an access network refers to a direction of data flow in a data stream towards a base station in the access network (or, if present, towards a user device). As used herein, "upstream" in an access network refers to a direction of data flow towards the core network. Unless otherwise noted, procedures described herein as being performed on data traveling in one direction may also be employed on data traveling in the other direction.

Instead of employing multiple data channels, a single data stream may include data transmitted in first and second formats. The data stream may be provided over a single transmission medium, or multiple transmission media. For example, each channel may be provided on a different transmission media.

As used herein, the term data channel includes any way of differentiating one set of data from another set of data. A data channel may include, but is not limited to, a physical data channel such as a wire, an intangible data channel such as a radio wave, data in a particular format, or data having particular characteristics that differentiate the data from other data.

One or more data channels in the access network 950 may originate, for example, at the user device 1010 or the base station 1030. A data stream in the data channel may be directed from the base station 1030 towards the core network 1050. The base station 1030 may interact with one or more intermediate service platforms 1040 located in the access network 950 or may interact directly with the core network 1050.

The intermediate service platforms 1040 may perform tasks such as resource management (directing control of the network in a manner that allows the efficient use of network resources), filtering (inspecting incoming and outgoing data in order to remove extraneous, harmful, or harassing data), and routing (directing network traffic towards its appropriate destination and providing user mobility management). Examples of intermediate service platforms 1040 include, but are not limited to, Radio Network Controllers, bridges, routers, and Virtual Private Network (VPN) servers.

One or more data channels may pass through the intermediate service platform 1040, each data channel carrying one or more streams of data. A bypass device 1060 allows one or more of the data channels to bypass the intermediate service platform 1040. The bypass device 1060 may be, for example, a server, a router, a switch, a computer system, or a custom-designed device. The bypass device may be deployed in combination with a remote node 1070 that facilitates or enables certain functionality provided by the bypass device 1060, such as compression.

Data channels or data streams in a network may be governed by one or more interfaces 1080, 1090. An interface in the context of a data stream refers to a set of protocols or technical characteristics that describe the connection between two entities and/or govern the transmission of data in the data stream. Each of the data streams provided between two devices in a network may be governed by different interfaces. For example, in a UMTS network, the data stream between the intermediate service platform 1040 (a Radio Network Controller, or RNC, in one example) and a gateway device located before the core network 1050 may be governed by the IuPS 1090 interface, and the data stream downstream of the intermediate service platform 180 may be governed by the IuB interface 1080 (although the IuB interface includes both upstream and downstream traffic). Other examples of interfaces in the UMTS framework include the IuR interface, for signaling between two different RNCs. One of ordinary skill in the art will recognize that the above interfaces are provided merely as examples, and that the present invention may be applied to networks using any types of interfaces.

In exemplary embodiments, the bypass device 1060 receives data on one or more interfaces, and sends data onto one or more interfaces. For example, if the bypass device 1060 receives data on the interface 1090 which is upstream of the intermediate service platform 1040, the bypass device 1060 may extract packet data from the upstream interface 1090, and inject some or all of the data back onto the upstream interface 1090. The bypass device 1040 may also inject data onto another interface that the bypass device 1040 is capable of reaching (e.g., the interface 1080 that is downstream of the intermediate service platform 1040). In this way, the bypass device 1060 may bypass the intermediate service platform 1040.

The user device 1010 may send a request for data content to the network, and in doing so, may cause the base station 1030 to start signaling the intermediate service platform 1040 using an interface 1080. Similarly, the core network may forward data to the access network, which may cause a device, such as a gateway device between the access network and the core network, to begin signaling the intermediate service platform 1040 using an interface 1090.

The bypass device 1060 may monitor this signaling on interface 1080 and interface 1090 to identify an active data session, for example, an active data session initiated on behalf of the intermediate service platform 1040, on behalf of a user device 1020, or on behalf of one or more devices in the core network 1050 or the access network 950. In order to monitor the signaling, the bypass device 1060 may intercept, monitor, or receive data or traffic on the interface 1080 and/or the interface 1090. For example, the bypass device 1060 may be include an input at a location in the data stream such that the data stream must pass through the input of the bypass device 1060 before the data stream passes through the intermediate service platform 1040. The bypass device 1060 may also include an output such that data can be inserted into the data stream. The output may be located on the opposite side of the intermediate service platform 1040 than the input. The bypass device 1060 may monitor the traffic for an indication that a data session is being initiated, terminated, modified or moved, has already been initiated, terminated, modified or moved, or is about to be initiated, terminated, modified or moved.

The bypass device 1060 may also be located at a location such that the data stream passes through both the intermediate service platform 1040 and the bypass device 1060. The bypass device 1060 can monitor and/or intercept the traffic that passes through both interfaces 1080, 1090.

Once an active data session is identified, the bypass device 1060 may take over the processing and handling of data in the data session. For example, the bypass device 1060 may terminate and/or emulate the protocol layers involved in the active data session. The bypass device 1060 may send out acknowledgements or network commands based on the data received at the bypass device 1060. In exemplary embodiments where the bypass device 1060 is employed in an existing network structure without making changes to the existing network devices, the bypass device 1060 may emulate the existing network devices to make it appear that the network traffic is being routed to the destination intended by the other network devices. For example, if the core network 1050 directs data to the intermediate service platform 1040, and the bypass device 1060 receives the data before the intermediate service platform 1040, the bypass device may emulate the intermediate service platform 1040 by sending acknowledgements and other protocol messages to the core network 1050, possibly using an identifier associated with the intermediate service platform 1040. The bypass device 1060 may communicate that the data has been received by the intermediate service platform 1040 so that the core network believes that the data has been handled appropriately. In the downstream direction, the bypass device 1060 may emulate the intermediate service platform 1040 towards the base station 1030, for example by sending appropriate messages to the base station 1030 using identifiers associated with the intermediate service platform 1040.

Figure 11A:
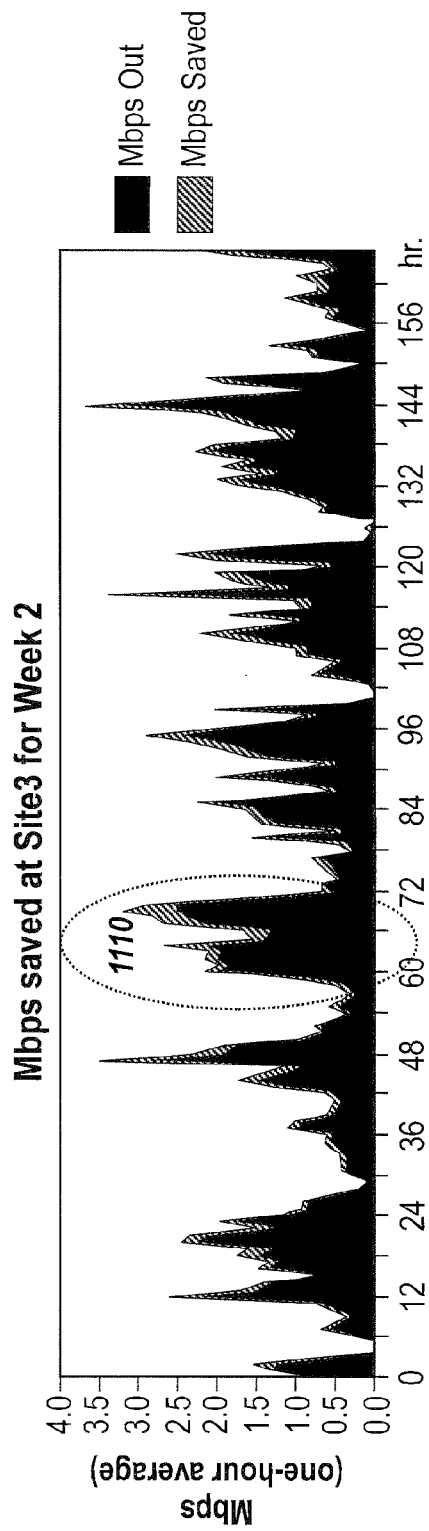
FIG. 11A is a graph depicting the number of Mbps saved over the course of a week by deploying a bypass device according to exemplary embodiments described herein.
Figure 11B:
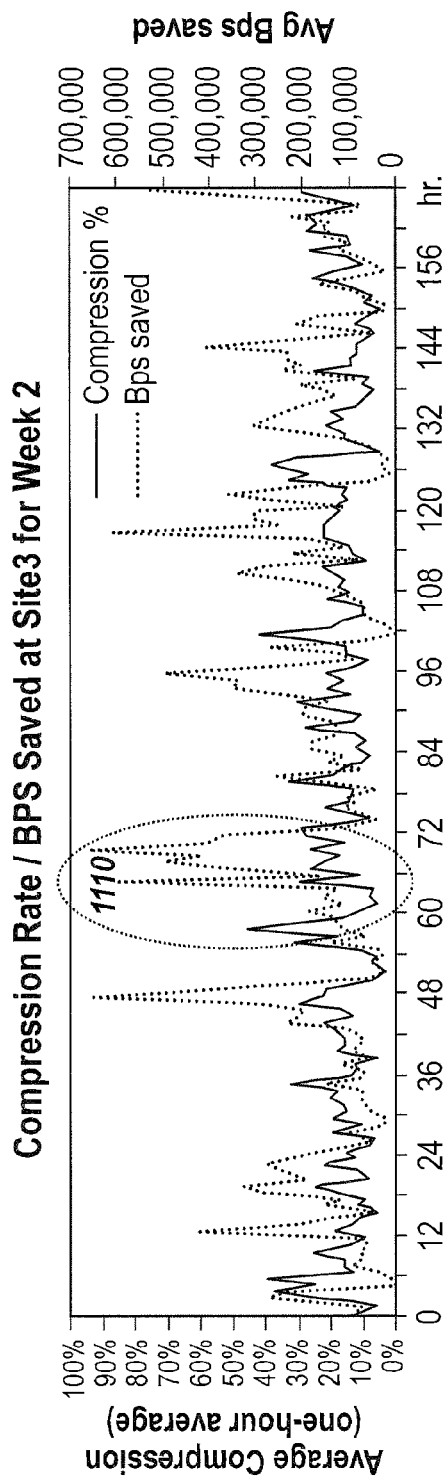
FIG. 11B is a graph comparing the compression rate of a data stream compressed by an exemplary bypass device to the number of Bps saved over the course of a week.

FIG. 11A is a graph depicting the number of Mbps saved over the course of a week by deploying a bypass device using compression methods according to exemplary embodiments described herein. FIG. 11B is a graph comparing the compression rate of a data stream compressed by an exemplary bypass device to the number of Bps saved over the course of a week. The time period 1110 indicates one peak period over which the backhaul utilization of the network was greatly reduced using the methods and devices described herein. Time period 1110 corresponds to the same time period in FIGS. 11A and 11B. During time period 1110, the exemplary system exhibited a more than 40% compression advantage over a conventional system, saving nearly 700,000 Bps and compressing the data by over 90%.

In the tests described by FIGS. 11A and 11B, the presently described system is capable of reducing backhaul utilization in the network by over 40% during peak periods as compared to a convention access network wherein the RNC is not bypassed.

Figure 12:
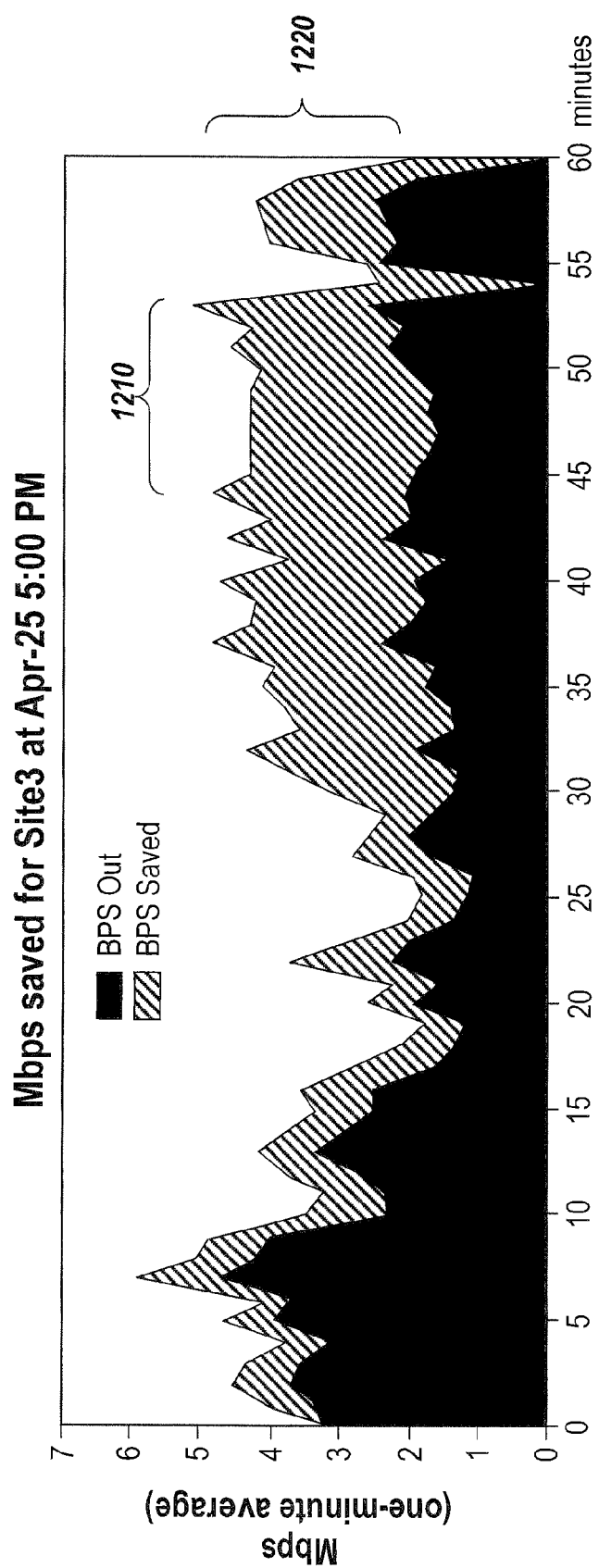
FIG. 12 depicts the number of Mbps saved over the course of an hour using an exemplary bypass device in a network during a peak usage hour.

FIG. 12 depicts the number of Mbps saved over the course of an hour using an exemplary Bypass in a network during a peak usage hour. As shown in FIG. 12, the maximum benefit is derived during periods of peak use. For example, during the peak period of use 1210, the peak savings 1220 over the course of one five-minute period in FIG. 12 were greater than 2.5 Mbps.

As demonstrated in FIGS. 11A-12, the present system effectively reduces the cost of mobile broadband service delivery without requiring expensive upgrades or changes to existing devices. Moreover, because the maximum benefit is derived during periods of peak use, the present compression methods effectively smooth rates of network traffic, thereby requiring fewer network resources during usage spikes.

Although the above description has been given with specific examples from a mobile network, one having ordinary skill in the art will recognize that the present invention is not so limited, and may be applied in any type of network.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the invention, and exclusive use of all modifications that come within the scope of the appended claims is reserved. It is intended that the present invention be limited only to the extent required by the appended claims and the applicable rules of law.

The invention claimed is:

1. A method performed in an electronic device in a communication network, the method compressing a stream of data being transmitted in the communication network, the method comprising:
   providing a circular buffer for holding data blocks, the circular buffer being divided into fixed equidistant boundaries defining one or more patterns in the processed data blocks;
   providing an indexing table that maps a value to a location in the circular buffer corresponding to the value, each location in the circular buffer corresponding to a pattern whose length is defined by the fixed equidistant boundaries, wherein each pattern is represented in the indexing table;
   receiving an original data block;
   identifying one or more matching patterns that each correspond to a pattern in the original data block that matches a pattern in the circular buffer, each of the matching patterns identified at least in part by calculating a pattern hashing value on the pattern in the original data block and referencing the indexing table to locate the pattern in the circular buffer;
   generating an output comprising one or more commands identifying each of the matching patterns and, if the original data block comprises further information in addition to the matching patterns, the output comprises the further information;
   storing the output in a memory of the electronic device or transmitting the output to another device in the communication network; and
   updating the circular buffer based on the original data block, wherein updating the circular buffer based on the original data block comprises:
      maintaining a write position that serves as an index to where the original data block is written to the circular buffer, and updating the indexing table using the pattern hashing value only if the write position is adjacent to one of the fixed equidistant boundaries of the circular buffer.

2. The method of claim 1, wherein:
each of the equidistant boundaries is offset from the previous boundary by an offset $\beta$;
the indexing table maps a hashing value calculated over a unit of data having a size of $\beta$ to a location in the circular buffer corresponding to the hashing value; and
the pattern in the original data block is of size $\beta$.

3. The method of claim 2, wherein $\beta$ is a power of 2.

4. The method of claim 1, wherein the circular buffer has a size that is a power of 2.

5. The method of claim 2, wherein the circular buffer comprises a number n of patterns indexed in the indexing table, and a number of hashing values mapped by the indexing table is also n.

6. The method of claim 1, wherein identifying the one or more matching patterns comprises:
calculating the pattern hashing value over a first subset of data in the original data block;
using the pattern hashing value as an offset into the indexing table to identify a targeted circular buffer address;
looking up a first set of circular buffer data that is present in the circular buffer at the targeted circular buffer address; and
comparing the first set of circular buffer data to the first subset of data to determine whether the first set of circular buffer data matches the first subset of data.

7. The method of claim 6, wherein the first set of circular buffer data matches the first subset of data, and further comprising:
identifying a second set of circular buffer data comprising the first set of circular buffer data, wherein the second set of circular buffer data matches a second subset of data in the original data block, the second subset of data comprising the first subset of data.

8. The method of claim 1, wherein the output further comprises one or more commands identifying data as redundant or non-redundant.

9. The method of claim 1, wherein the indexing table is updated to reflect the writing of the original data block to the circular buffer.

10. The method of claim 9, wherein:
the circular buffer is divided into equidistant boundaries, each boundary offset from the previous boundary by an offset $\beta$;
the indexing table maps a hashing value calculated over a unit of data having a size of $\beta$ to a location in the circular buffer corresponding to the hash value; and
updating the indexing table comprises:
calculating a new information hashing value for a subset of information between two of the equidistant boundaries;
using the new information hashing value as an index location to the indexing table; and
updating the indexing table at the index location with a value corresponding to the position in the circular buffer to which the subset of information is being written divided by $\beta$.

11. A non-transitory electronic device readable storage medium storing electronic device readable instructions that, when executed by a processor in an electronic device, perform a method for compressing data, the method comprising:
providing a circular buffer for holding data blocks, the circular buffer being divided into fixed equidistant boundaries defining one or more patterns in the data blocks;
providing an indexing table that maps a value to a location in the circular buffer corresponding to the value, each location in the circular buffer corresponding to a pattern whose length is defined by the fixed equidistant boundaries;
receiving an original data block;
identifying one or more matching patterns that each correspond to a pattern in the original data block that matches a pattern in the circular buffer, each of the matching patterns identified at least in part by calculating a pattern hashing value on the pattern in the original data block and referencing the indexing table to locate the pattern in the circular buffer;
generating an output comprising one or more commands identifying each of the matching patterns and, if the original data block comprises further information in addition to the matching patterns, comprising the further information;
storing the output in a memory of the electronic device or transmitting the output to another electronic device in a communication network; and
updating the circular buffer based on the original data block, wherein updating the circular buffer based on the original data block comprises:
maintaining a write position that serves as an index to where the original data block is written to the circular buffer, and
updating the indexing table using the pattern hashing value only if the write position is adjacent to one of the fixed equidistant boundaries of the circular buffer.

12. The electronic device readable storage medium of claim 11, wherein:
the circular buffer is divided into equidistant boundaries, each boundary offset from the previous boundary by an offset $\beta$;
the indexing table maps a hashing value calculated over a unit of data having a size of $\beta$ to a location in the circular buffer corresponding to the hash value; and
the pattern in the original data block is of size $\beta$.

13. The electronic device readable storage medium of claim 11, wherein identifying the one or more matching patterns comprises:
calculating the pattern hashing value over a first subset of data in the original data block;
using the pattern hashing value as an offset into the indexing table to identify a targeted circular buffer address;
looking up a first set of circular buffer data that is present in the circular buffer at the targeted circular buffer address; and
comparing the first set of circular buffer data to the first subset of data to determine whether the first set of circular buffer data matches the first subset of data.

14. The electronic device readable storage medium of claim 13, wherein the first set of circular buffer data matches the first subset of data, and further comprising:
identifying a second set of circular buffer data comprising the first set of circular buffer data, wherein the second set of circular buffer data matches a second subset of data in the original data block, the second subset of data comprising the first subset of data.

15. The electronic device readable storage medium of claim 11, wherein:

the circular buffer is divided into equidistant boundaries, each boundary offset from the previous boundary by an offset $\beta$;

the indexing table maps a hashing value calculated over a unit of data having a size of $\beta$ to a location in the circular buffer corresponding to the hash value; and updating the indexing table comprises:
calculating a new information hashing value for a subset of information between two of the equidistant boundaries;
using the new information hashing value as an index location to the indexing table; and
updating the indexing table at the index location with a value corresponding to the position in the circular buffer to which the subset of information is being written divided by $\beta$.

16. An electronic device comprising:
a memory for storing electronic device readable instructions that, when executed by a processor in the electronic device, perform a method for compressing a stream of data being transmitted in a communication network;
a processor for:
providing a circular buffer for holding data blocks, the circular buffer being divided into fixed equidistant boundaries defining one or more patterns in the processed data blocks,
providing an indexing table that maps a value to a location in the circular buffer corresponding to the value, each location in the circular buffer corresponding to a pattern whose length is defined by the fixed equidistant boundaries, wherein each pattern is represented in the indexing table,
receiving an original data block,
identifying one or more matching patterns that each correspond to a pattern in the original data block that matches a pattern in the circular buffer, each of the matching patterns identified at least in part by calculating a pattern hashing value on the pattern in the original data block and referencing the indexing table to locate the pattern in the circular buffer, and
updating the circular buffer based on the original data block, wherein updating the circular buffer based on the original data block comprises:
maintaining a write position that serves as an index to where the original data block is written to the circular buffer, and
updating the indexing table using the pattern hashing value only if the write position is adjacent to one of the fixed equidistant boundaries of the circular buffer; and
a transmitter for transmitting an output to another device in the communication network, where the output comprises one or more commands identifying each of the matching patterns and, if the original data block comprises further information in addition to the matching patterns, the output comprises the further information.

17. The electronic device of claim 16, wherein:
the circular buffer is divided into equidistant boundaries, each boundary offset from the previous boundary by an offset $\beta$;
the indexing table maps a hashing value calculated over a unit of data having a size of $\beta$ to a location in the circular buffer corresponding to the hash value; and
the pattern in the original data block is of size $\beta$.

18. The electronic device of claim 16, wherein identifying the one or more matching patterns comprises:
calculating the pattern hashing value over a first subset of data in the original data block;
using the pattern hashing value as an offset into the indexing table to identify a targeted circular buffer address;
looking up a first set of circular buffer data that is present in the circular buffer at the targeted circular buffer address; and
comparing the first set of circular buffer data to the first subset of data to determine whether the first set of circular buffer data matches the first subset of data.

19. The electronic device of claim 18, wherein the first set of circular buffer data matches the first subset of data, and further comprising:
identifying a second set of circular buffer data comprising the first set of circular buffer data, wherein the second set of circular buffer data matches a second subset of data in the original data block, the second subset of data comprising the first subset of data.

20. The electronic device of claim 16, wherein:
the circular buffer is divided into equidistant boundaries, each boundary offset from the previous boundary by an offset $\beta$;
the indexing table maps a hashing value calculated over a unit of data having a size of $\beta$ to a location in the circular buffer corresponding to the hash value; and
updating the indexing table comprises:
calculating a new information hashing value for a subset of information between two of the equidistant boundaries;
using the new information hashing value as an index location to the indexing table; and
updating the indexing table at the index location with a value corresponding to the position in the circular buffer to which the subset of information is being written divided by $\beta$.

21. A method performed in an electronic device in a communication network, the method decompressing a compressed data block, the compressed data block being a compressed representation of an original data block, the method comprising:
providing a circular buffer for holding data blocks, the circular buffer being divided into fixed equidistant boundaries defining one or more patterns in the processed data blocks, each of the fixed equidistant boundaries being offset from the previous boundary by an offset $\beta$, where $\beta$ is a power of 2;
receiving a compressed data block comprising one or more commands identifying one or more matching patterns that correspond to data found in the circular buffer;
identifying, based on the one or more commands, one or more matching patterns that each correspond to a pattern in the original data block that matches a pattern in the circular buffer;
retrieving the one or more matching patterns from the circular buffer;
generating an output that corresponds to the original data block;
storing the output in a memory of the electronic device or transmitting the output to another device; and
updating the circular buffer based on the original data block, wherein updating the circular buffer based on the original data block comprises writing the original data block to the circular buffer and, if any overflow information in the original data block extends beyond the end of the circular buffer, writing the overflow information to the beginning of the circular buffer.

* * * * *